United States Patent
Ahn et al.

(10) Patent No.: US 12,317,436 B2
(45) Date of Patent: May 27, 2025

(54) DISPLAY DEVICE

(71) Applicant: Samsung Display Co., LTD., Yongin-si (KR)

(72) Inventors: Sung Sang Ahn, Yongin-si (KR); Young Min Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 161 days.

(21) Appl. No.: 18/102,119

(22) Filed: Jan. 27, 2023

(65) Prior Publication Data
US 2023/0403806 A1    Dec. 14, 2023

(30) Foreign Application Priority Data
Jun. 8, 2022 (KR) .......................... 10-2022-0069281

(51) Int. Cl.
*H05K 5/02* (2006.01)
(52) U.S. Cl.
CPC .................................. *H05K 5/0217* (2013.01)
(58) Field of Classification Search
CPC .......... H05K 5/00; H05K 5/02; H05K 5/0216; G06F 1/1624; G06F 1/1615; G06F 1/1647; G06F 1/1652; G06F 1/163
USPC ... 361/679.27, 679.39, 679.43–44, 749, 803, 361/814
See application file for complete search history.

(56) References Cited

U.S. PATENT DOCUMENTS

| | | | |
|---|---|---|---|
| 10,019,036 B2* | 7/2018 | Sun | G06F 1/1652 |
| 10,416,796 B2* | 9/2019 | Song | H10K 50/84 |
| 12,088,744 B2* | 9/2024 | Lee | H04M 1/0237 |
| 2012/0212433 A1* | 8/2012 | Lee | G06F 1/1643 345/173 |
| 2014/0194165 A1* | 7/2014 | Hwang | G06F 3/147 455/566 |
| 2017/0262022 A1* | 9/2017 | Choi | G06F 1/1652 |
| 2018/0190936 A1* | 7/2018 | Lee | B32B 3/30 |
| 2020/0314225 A1* | 10/2020 | Ahn | G06F 1/1652 |
| 2022/0075418 A1* | 3/2022 | Song | G06F 1/1656 |
| 2022/0087040 A1* | 3/2022 | Song | G06F 1/1681 |
| 2022/0155823 A1* | 5/2022 | Shin | G09F 9/301 |

FOREIGN PATENT DOCUMENTS

KR    10-2021-0083442    7/2021

* cited by examiner

*Primary Examiner* — Tuan T Dinh
(74) *Attorney, Agent, or Firm* — KILE PARK REED & HOUTTEMAN PLLC

(57) ABSTRACT

A display device includes: a display module slid in a first direction; and a panel storage container including a guide rail guiding a sliding operation of the display module in the first direction. The display module is engaged with the guide rail in a second direction intersecting the first direction, and the guide rail includes: a first flat portion adjacent to an upper surface of the panel storage container; a second flat portion adjacent to a lower surface of the panel storage container; and a bent portion adjacent to a side surface of the panel storage container and connecting the first flat portion and the second flat portion to each other. The bent portion includes: a first bent portion bent at a first radius of curvature; and a second bent portion bent at a second radius of curvature greater than the first radius of curvature.

20 Claims, 20 Drawing Sheets

RA: RA_1
SD: SD_1, SD_2
SD_1: SD_1a, SD_1b

DA: DA_1, DA_2
SD: SD_1, SD_2
RA: RA_1
SD_1: SD_1a, SD_1b

GR1: 110, 130, 140, 150, 170

GR2: 112, 132, 142, 152, 172

DISPLAY DEVICE

CROSS-REFERENCE TO RELATED APPLICATION(S)

This application claims priority to and benefits of Korean Patent Application No. 10-2022-0069281 under 35 U.S.C. § 119, filed on Jun. 8, 2022, in the Korean Intellectual Property Office, the entire contents of which are incorporated herein by reference.

BACKGROUND

1. Technical Field

Embodiments relate to a display device.

2. Description of the Related Art

The importance of display devices has increased with the development of multimedia. Accordingly, various types of display devices such as an organic light emitting display (OLED) and a liquid crystal display (LCD) have been used.

Recently, with the development of display technology, research and development of display devices having flexible displays have been actively conducted. The flexible display may extend or reduce a display screen by, e.g., folding, bending, or sliding the display screen to implement a decrease in volume or a design change of the display device.

SUMMARY

Embodiments provide a display device capable of facilitating sliding behavior.

Embodiments also provide a panel storage container capable of facilitating sliding behavior of a display panel.

However, embodiments of the disclosure are not limited to those set forth herein. The above and other embodiments will become more apparent to one of ordinary skill in the art to which the disclosure pertains by referencing the detailed description of the disclosure given below.

According to an embodiment, a display device may include: a display module slid in a first direction; and a panel storage container including a guide rail guiding a sliding operation of the display module in the first direction, wherein the display module may be engaged with the guide rail in a second direction intersecting the first direction, the guide rail may include: a first flat portion adjacent to an upper surface of the panel storage container and extending in the first direction; a second flat portion adjacent to a lower surface of the panel storage container opposing the upper surface and extending in the first direction; and a bent portion adjacent to a side surface of the panel storage container connecting the upper surface and the lower surface of the panel storage container to each other and connecting the first flat portion and the second flat portion to each other, the bent portion including: a first bent portion bent at a first radius of curvature; and a second bent portion connected to the first bent portion and bent at a second radius of curvature greater than the first radius of curvature.

In an embodiment, a first end portion of the first bent portion of the guide rail may be connected to the first flat portion of the guide rail, a second end portion of the first bent portion of the guide rail may be connected to a first end portion of the second bent portion of the guide rail, and a second end portion of the second bent portion of the guide rail may be connected to the second flat portion of the guide rail.

In an embodiment, the bent portion of the guide rail may have a convex shape in a direction toward the side surface of the panel storage container.

In an embodiment, a length of an arc formed by the second bent portion of the guide rail may be greater than a length of an arc formed by the first bent portion of the guide rail.

In an embodiment, the first end portion of the first bent portion of the guide rail may overlap the second bent portion of the guide rail in a third direction perpendicular to the first direction and the second direction, and the second end portion of the second bent portion of the guide rail may overlap the first flat portion of the guide rail in the third direction.

In an embodiment, the display module may include: a display panel including a plurality of pixels on an upper surface thereof; and a plurality of segments attached to a lower surface of the display panel opposing the upper surface of the display panel, and the plurality of segments may be spaced apart from each other in the first direction and extend in the second direction intersecting the first direction to be engaged with the guide rail.

In an embodiment, the number of segments engaged with the second bent portion among the plurality of segments may be greater than the number of segments engaged with the first bent portion.

In an embodiment, the bent portion of the guide rail may further include a curvature change portion defined as a portion where the second end portion of the first bent portion of the guide rail and the first end portion of the second bent portion of the guide rail may be connected to each other, and the curvature change portion of the guide rail may be disposed to be closer to the first flat portion than to the second flat portion.

In an embodiment, an orientation of the display module may be changed based on a portion engaged with the curvature change portion.

In an embodiment, a display device may further include a roller member surrounded by the display module that is bent, wherein the roller member may be adjacent to the curvature change portion of the guide rail.

In an embodiment, a straight line passing through the curvature change portion, a center of the first radius of curvature, and a center of the second radius of curvature may be substantially parallel to the first direction.

According to an embodiment, a display device may include: a display module slid in a first direction; and a panel storage container including a guide rail guiding a sliding operation of the display module in the first direction, wherein the display module may be engaged with the guide rail in a second direction intersecting the first direction, the guide rail may include: a first flat portion adjacent to an upper surface of the panel storage container and extending in the first direction; a second flat portion adjacent to a lower surface of the panel storage container opposing the upper surface and extending in the first direction; and a bent portion adjacent to a side surface of the panel storage container and connecting the first flat portion and the second flat portion of the guide rail to each other, the bent portion including: a first bent portion bent toward the upper surface of the panel storage container; and a second bent portion connected to the first bent portion and bent toward the lower surface of the panel storage container, and an orientation change portion defined as a boundary area between the first bent portion and the second bent portion is disposed to be closer to the first flat portion than to the second flat portion.

In an embodiment, the display module may be engaged with the first flat portion, the first bent portion, the second bent portion, and the second flat portion to surround an inner portion of the panel storage container.

In an embodiment, the display module may include: a display panel including a plurality of pixels on an upper surface of the display panel; and a plurality of segments attached to a lower surface of the display panel opposing the upper surface of the display panel, and the plurality of segments may be spaced apart from each other in the first direction and extend in the second direction intersecting the first direction to be engaged with the guide rail.

In an embodiment, the number of segments engaged with the second bent portion among the plurality of segments may be greater than the number of segments engaged with the first bent portion.

In an embodiment, the upper surface of the display panel may be bent toward the upper surface of the panel storage container along the first bent portion, may be bent toward the lower surface of the panel storage container along the second bent portion, and may be oriented toward the second direction in the orientation change portion.

In an embodiment, the first bent portion of the guide rail may be bent at a first curvature, and the second bent portion of the guide rail may be bent at a second curvature smaller than the first curvature.

According to an embodiment, a panel storage container storing a display panel may include a guide rail guiding a sliding operation of the display panel in a first direction, wherein the guide rail may include: a first flat portion adjacent to an upper surface of the panel storage container and extending in the first direction; a second flat portion adjacent to a lower surface of the panel storage container opposing the upper surface and extending in the first direction; and a bent portion adjacent to a side surface of the panel storage container, having a bent shape, and connecting the first flat portion and the second flat portion to each other, the bent portion including: a first bent portion having a first radius of curvature; and a second bent portion connected to the first bent portion and having a second radius of curvature greater than the first radius of curvature.

In an embodiment, a first end portion of the first bent portion of the guide rail may be connected to the first flat portion, a second end portion of the first bent portion of the guide rail may be connected to a first end portion of the second bent portion, and the second end portion of the second bent portion of the guide rail may be connected to the second flat portion of the guide rail.

In an embodiment, the bent portion of the guide rail may have a convex shape in a direction toward the side surface of the panel storage container.

A display device according to an embodiment may facilitate sliding behavior.

A panel storage container according to an embodiment may facilitate sliding behavior of a display panel.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1A:
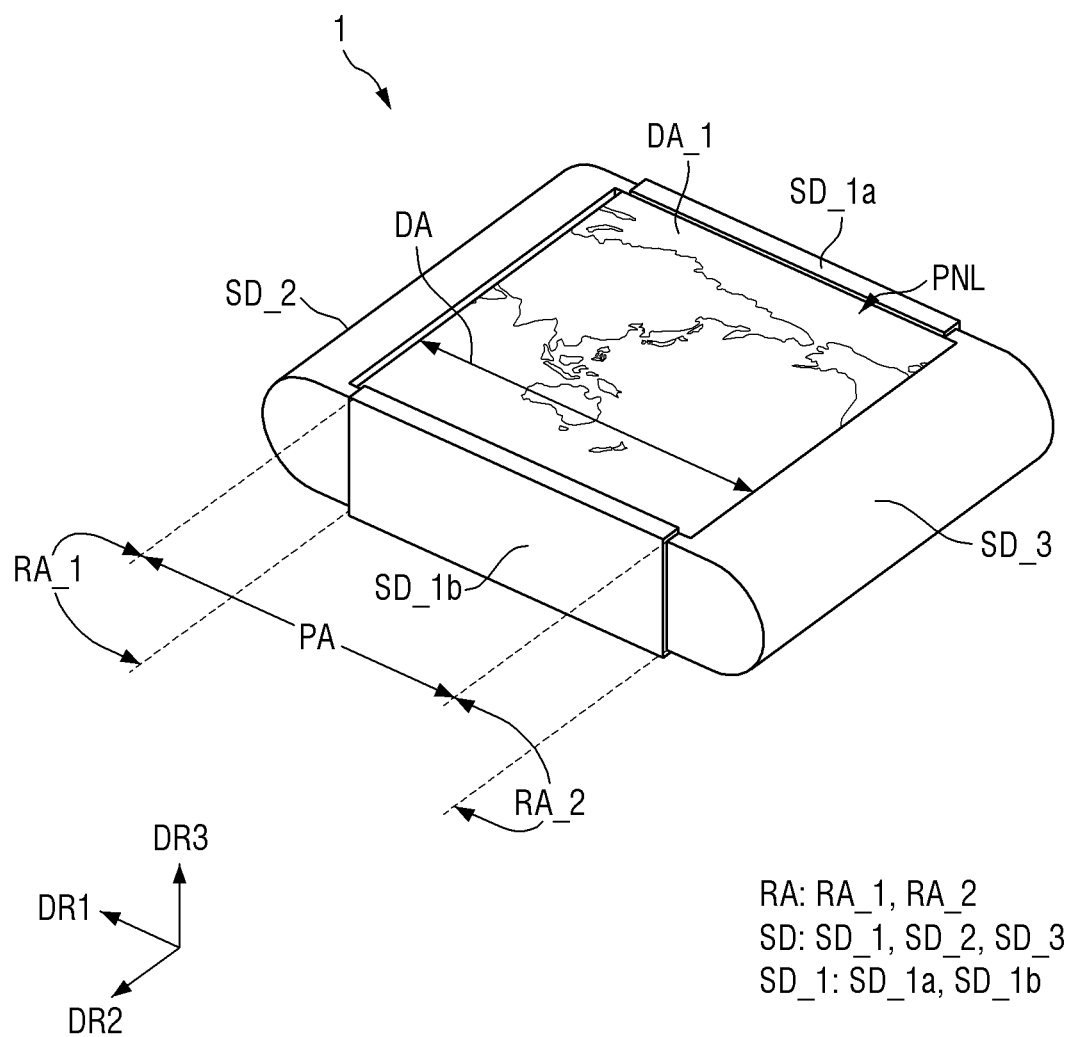
FIG. 1A is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z—axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Hereinafter, specific embodiments will be described with reference to the accompanying drawings.

Figure 1B:
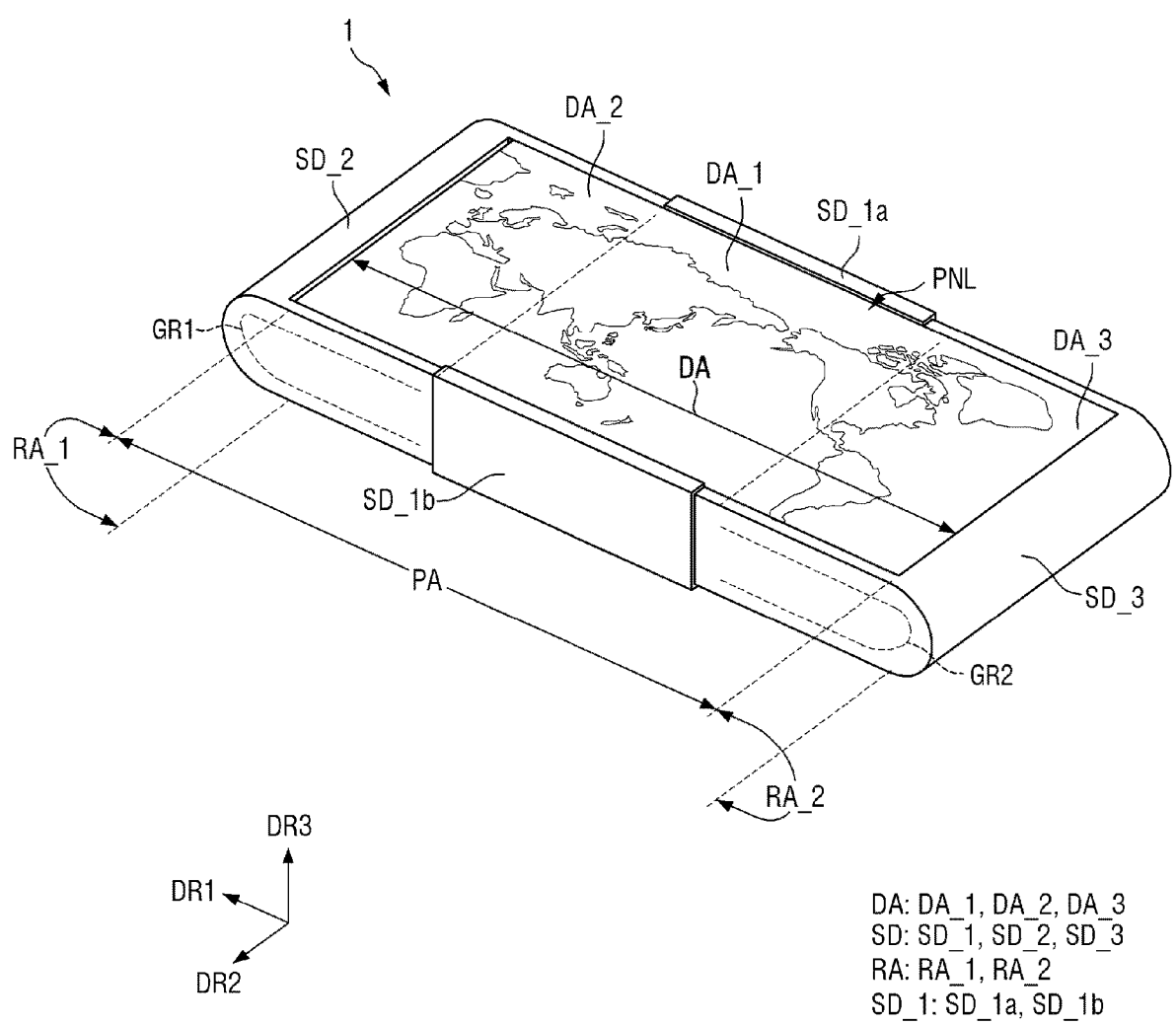
FIG. 1B is a schematic perspective view illustrating a form in which the display device according to an embodiment is extended.
Figure 2A:
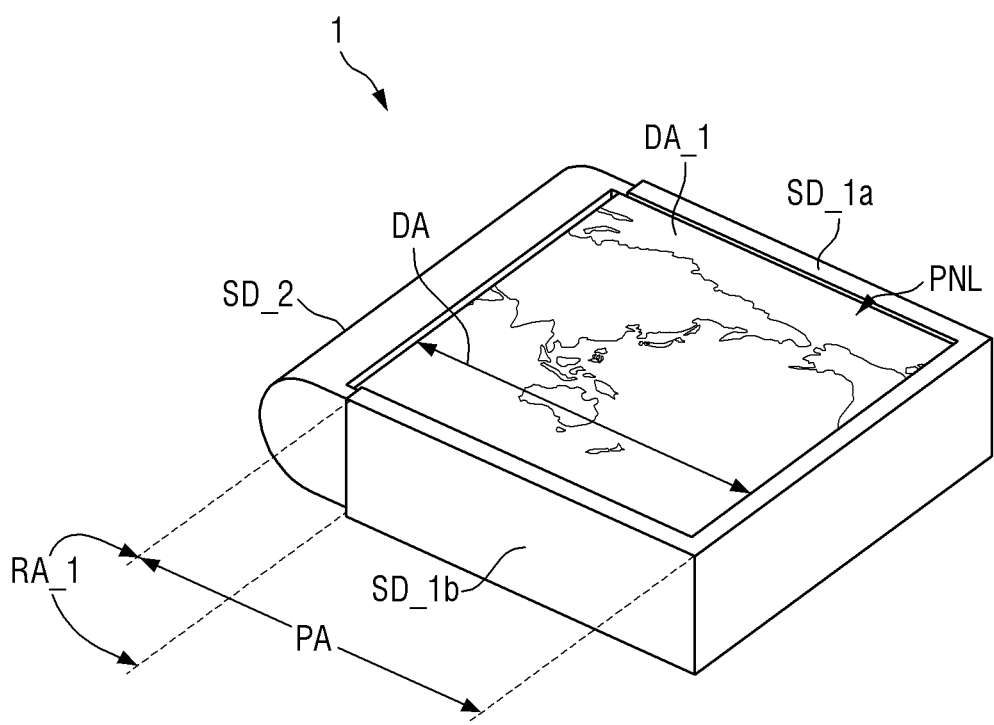
FIG. 2A is a schematic perspective view illustrating another example of the display device according to an embodiment.
Figure 2B:
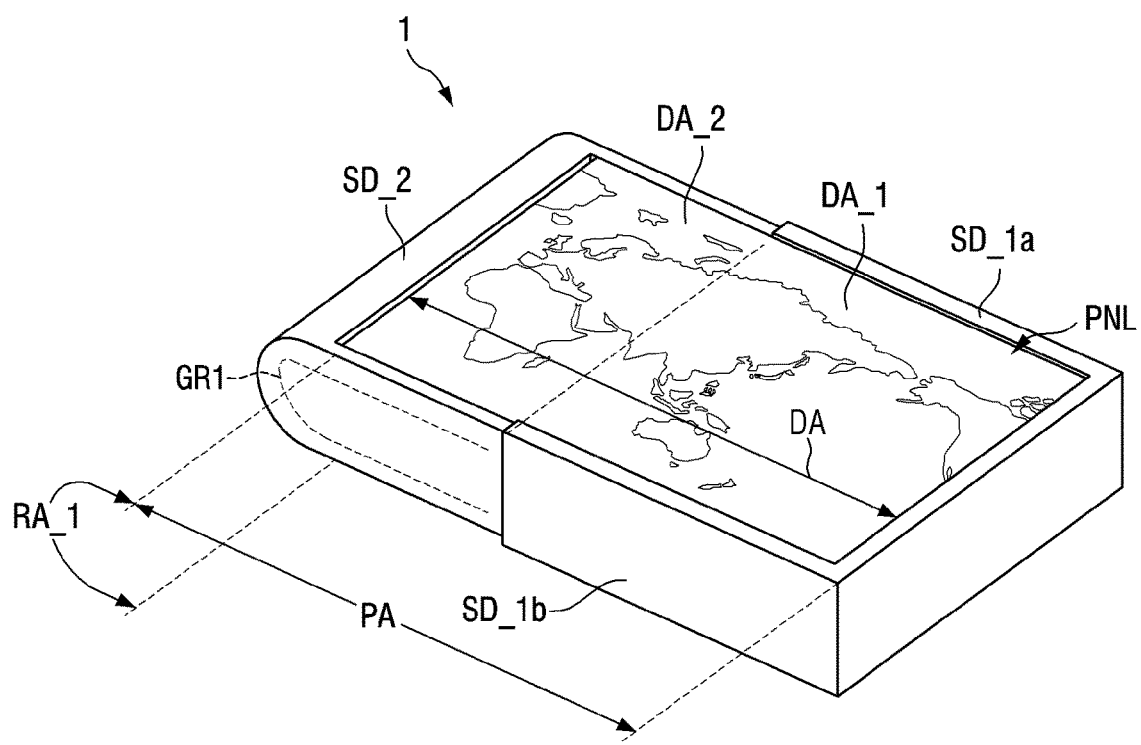
FIG. 2B is a schematic perspective view illustrating a form in which the display device according to an embodiment of FIG. 2A is extended.
Figure 2B:
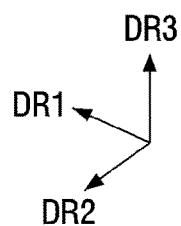
Figure 3:
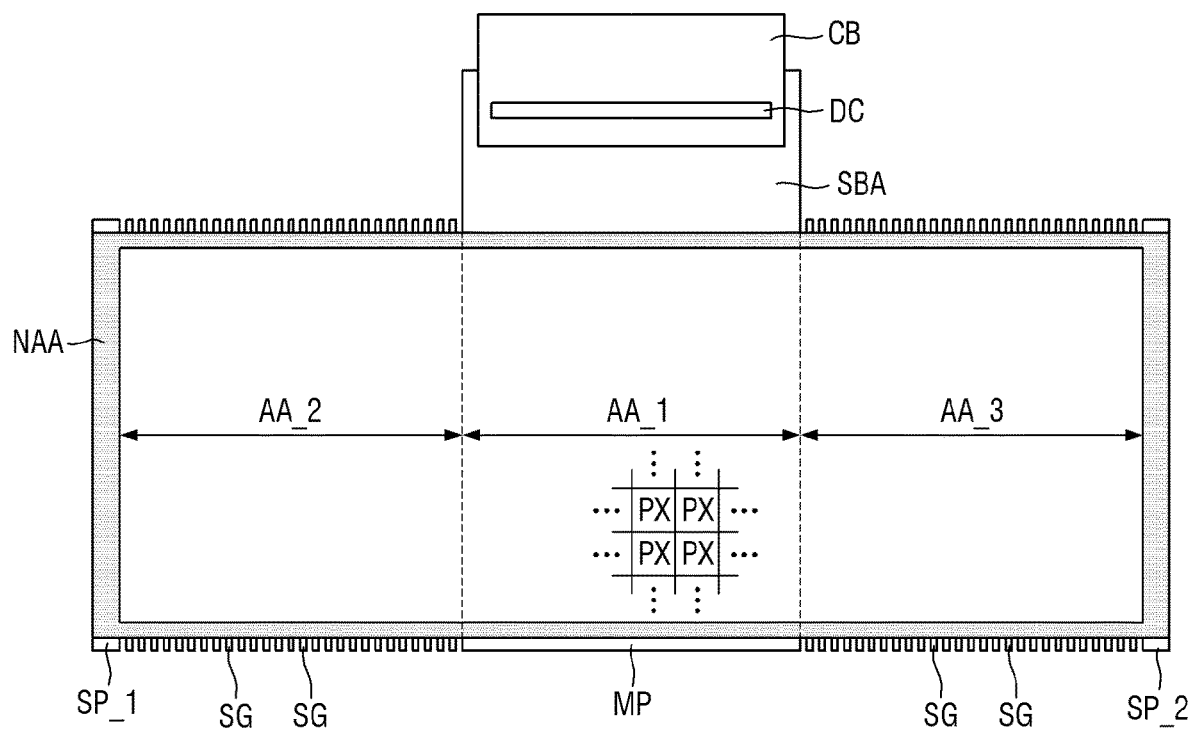
FIG. 3 is a schematic plan view of a display module of the display device according to an embodiment.
Figure 4:
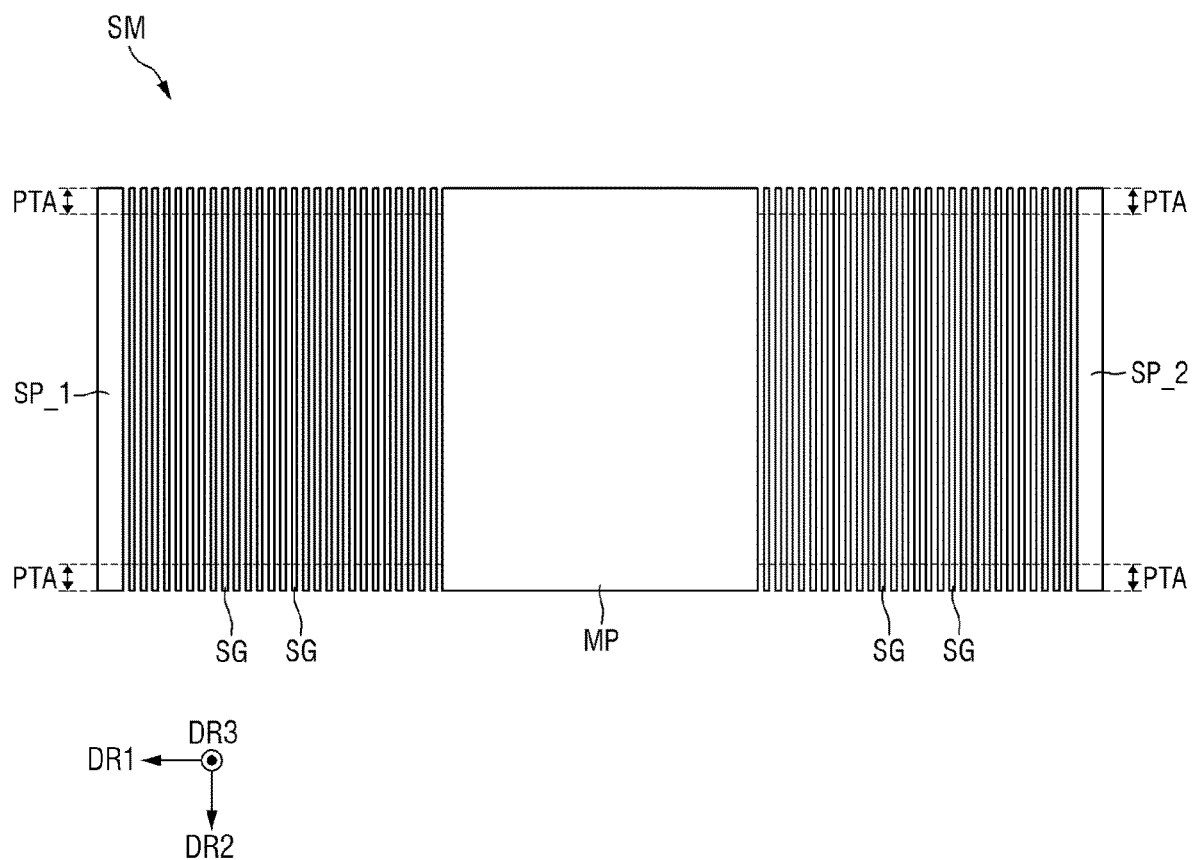
FIG. 4 is a schematic plan view of a panel support of the display module according to an embodiment.
Figure 5:
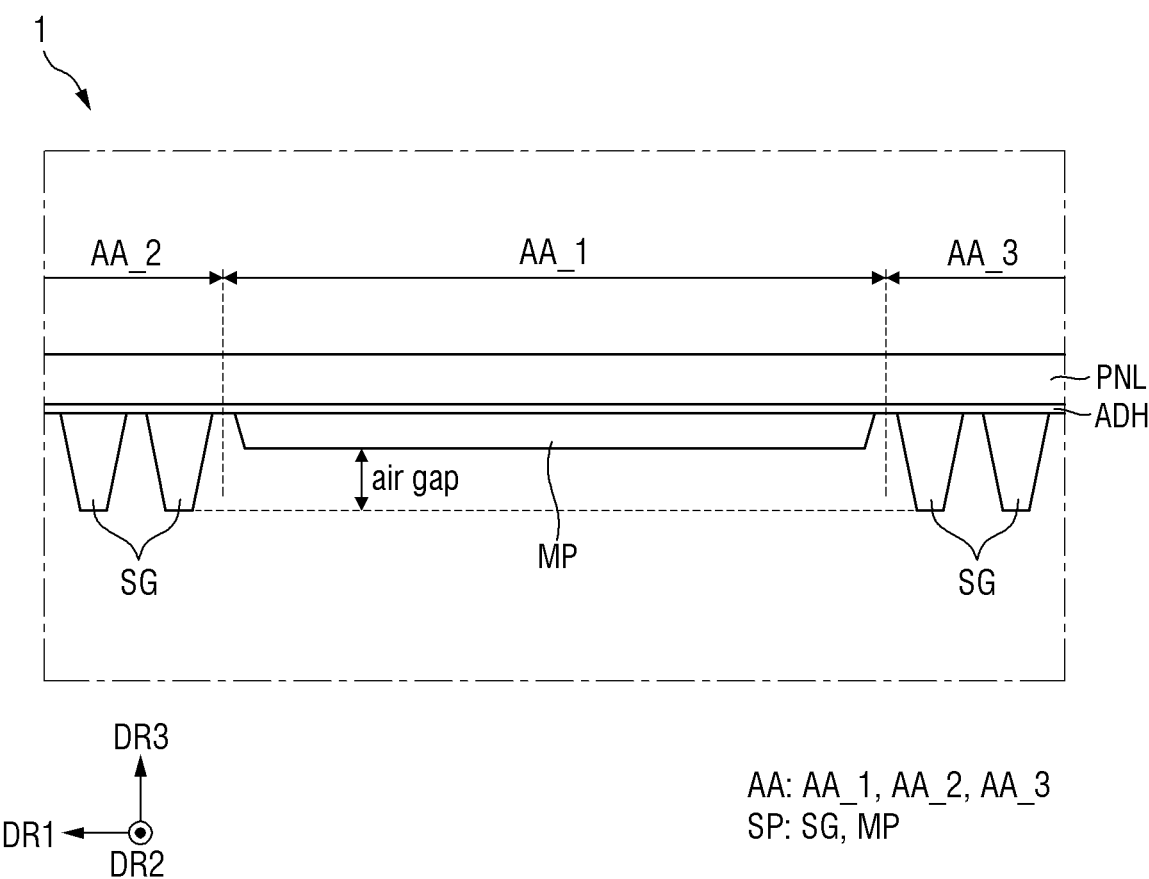
FIG. 5 is a schematic side view of the display module according to an embodiment.

FIG. 1A is a schematic perspective view of a display device 1 according to an embodiment. FIG. 1B is a schematic perspective view illustrating a form in which the display device 1 according to an embodiment is extended. FIG. 2A is a schematic perspective view illustrating another example of the display device 1 according to an embodiment. FIG. 2B is a schematic perspective view illustrating a form in which the display device 1 according to an embodiment of FIG. 2A is extended. FIG. 3 is a schematic plan view of a display module of the display device 1 according to an embodiment. FIG. 4 is a schematic plan view of a panel support of the display module according to an embodiment. FIG. 5 is a schematic side view of the display module according to an embodiment.

In FIGS. 1A and 1B, a first direction DR1, a second direction DR2, and a third direction DR3 are defined. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a transverse direction in the drawing, the second direction DR2 refers to a longitudinal direction in the drawing, and the third direction DR3 refers to an upward and downward direction (i.e., a thickness direction) in the drawing. In the following specification, unless otherwise specified, the term "direction" may refer to directions (e.g., opposite directions) toward sides (e.g., opposite sides) extending along the direction. When both "directions" extending to sides (e.g., opposite sides) need to be distinguished from each other, a side will be referred to as "a side in the direction" and another side will be referred to as "another side in the direction". In FIG. 1A, an arrow direction will be referred to as a side, and a direction opposite to the arrow direction will be referred to as another side.

Hereinafter, for convenience of explanation, in referring to a display device 1 or surfaces of respective members included in the display device 1, a surface facing a side in a direction in which an image is displayed, e.g., the third direction DR3 will be referred to as an upper surface, and another surface opposite to the surface will be referred to as a lower surface. However, embodiments are not limited thereto, and the surface and another surface of the member may be referred to as a front surface and a rear surface, respectively, or may be referred to as a first surface or a second surface, respectively. In describing relative positions of the respective members of the display device 1, a side in the third direction DR3 may be referred to as an upper portion and another side in the third direction DR3 may be referred to as a lower portion.

Referring to FIGS. 1A and 1B, the display device 1 according to an embodiment may be a sliding display device or a slidable display device capable of sliding in the first direction DR1. The display device 1 according to an embodiment may be a multi-slidable display device slid in directions (e.g., opposite directions), but embodiments are not limited thereto. For example, the display device 1 may be a single slidable display device slid in only one direction as illustrated in FIGS. 2A and 2B. Hereinafter, it will be described that the display device 1 according to an embodiment is a multi-slidable display device.

The display device 1 may include a flat area PA and a bent area RA. The flat area PA of the display device 1 may overlap the area exposing a display panel PNL of a panel storage container SD to be described below. The bent area RA of the display device 1 may be formed inside the panel storage container SD. The bent area RA of the display device 1 may be bent at a predetermined radius of curvature, and may be an area in which the display panel PNL may be bent according to the radius of curvature. The bent area RA of the display device 1 may be disposed on sides (e.g., opposite sides) of the flat area PA in the first direction DR1. The bent area RA of the display device 1 may include a first bent area RA_1 and a second bent area RA_2. For example, the first bent area RA_1 may be disposed on another side (e.g., left side) of the flat area PA in the first direction DR1, and the second bent area RA_2 may be disposed on a side (e.g., right side) of the flat area PA in the first direction DR1. The first bent area RA_1 may be an area in which a second active area AA_2 of a display panel PNL to be described below is bent.

The second bent area RA_2 may be an area in which a third active area AA_3 of a display panel to be described below is bent. As the display device 1 is extended, an area of the flat area PA may increase as illustrated in FIG. 1B. Accordingly, an interval between the first bent area RA_1 and the second bent area RA_2 may increase.

Referring to FIGS. 1A to 5, the display device 1 according to an embodiment may include a display module DM and a panel storage container SD.

The display module DM may include the display panel PNL and a panel support SM.

The display panel PNL of the display module DM is a panel that includes pixels PX to display an image, and any type of display panel such as an organic light emitting display panel including an organic emission layer, a micro light emitting diode display panel by using a micro light emitting diode (LED), a quantum dot light emitting display panel by using a quantum dot light emitting diode including a quantum dot emission layer, or an inorganic light emitting display panel by using an inorganic light emitting element including an inorganic semiconductor may be applied as the display panel PNL.

The display panel PNL may be a flexible panel. The display panel PNL may have flexibility so as to be partially rolled, bent, or curved within the panel storage container SD as described below. The display panel PNL may be slid in the first direction DR1.

The display panel PNL may include an active area AA and a non-active area NAA.

The active area AA of the display panel PNL may be an area in which the pixels PX are disposed. The active area AA may include a first active area AA_1 supported by a main plate MP to be described below, a second active area AA_2 supported by segments SG, and a third active area AA_3 supported by segments SG. The first active area AA_1 of the display panel PNL may be an always flat area capable of maintaining a flat shape regardless of a sliding operation.

The second active area AA_2 and the third active area AA_3 of the display panel PNL may be bent areas or bendable areas which are rolled, bent, or curved or in which a shape in which they are rolled, bent, or curved is changed into a flat shape according to a sliding operation of the display device 1. The second active area AA_2 and the third active area AA_3 of the display panel PNL may be bent by rollers R.

A display area DA of the display panel PNL may be an area in which an image is displayed. The display area DA may be divided into a first display area DA_1, a second display area DA_2, and a third display area DA_3 according to whether or not and how much the display panel PNL has been slid. The presence or absence and areas of the second display area DA_2 and the third display area DA_3 may vary according to whether or not and how much the display panel PNL has been slid. In a non-sliding state, the display panel PNL may have the first display area DA_1 having a first area. In a sliding state, the display area DA further includes the second display area DA_2 and the third display area DA_3 that are extended in addition to the first display area DA_1.

The first display area DA_1 may overlap the first active area AA_1 of the display panel PNL. The second display area DA_2 may overlap at least a portion of the second active area AA_2 of the display panel PNL. The third display area DA_3 may overlap at least a portion of the third active area AA_3 of the display panel PNL. For example, the second display area DA_2 may be an area in which the second active area AA_2 of the display panel PNL and the flat area PA overlap each other, and the third display area DA_3 may be an area in which the third active area AA_3 of the display panel PNL and the flat area PA overlap each other.

In some embodiments, a boundary area between the first display area DA_1 and the second display area DA_2 may coincide with a boundary area between the first active area AA_1 and the second active area AA_2, and a boundary area between the first display area DA_1 and the third display area DA_3 may coincide with a boundary area between the first active area AA_1 and the third active area AA_3, but embodiments are not limited thereto.

The areas of the second display area DA_2 and the third display area DA_3 may vary according to how much the display device 1 has been slid. For example, in a state in which the display device 1 is slid as much as possible, the second display area DA_2 may have a second area, the third display area DA_3 may have a third area, and the display area DA may have a fourth area that is the sum of the first area, the second area, and the third area. For example, the fourth area may be a maximum area that the display area DA may have.

The non-active area NAA of the display panel PNL may be an area in which the pixels PX are not disposed. Metal lines such as data/scan lines, touch lines, or source voltage lines may be disposed in the non-active area NAA.

The display panel PNL may further include a sub-area SBA. The sub-area SBA may be disposed on another side (e.g., rear lateral side) of the first active area AA_1 of the display panel PNL in the second direction DR2. For example, the sub-area SBA may protrude from the non-active area NAA to another side (e.g., rear lateral side) in the second direction DR2.

The sub-area SBA may overlap the first active area AA_1 in the second direction DR2, and may not overlap the second active area AA_2 and the third active area AA_3 in the second direction DR2.

In some embodiments, the sub-area SBA may have a rectangular shape in plan view, but embodiments are not limited thereto. In some embodiments, a length of the sub-area SBA in the first direction DR1 may be substantially the same as a length of the first active area AA_1 in the first direction DR1, but embodiments are not limited thereto. In another example, a length of the sub-area SBA in the first direction DR1 may be smaller than a length of the first active area AA_1 in the first direction DR1. A length of the sub-area SBA in the second direction DR2 may be smaller than a length of the first active area AA_1 in the second direction DR2.

The sub-area SBA may be an area that is curved or bent. In case that the sub-area SBA is bent, the sub-area SBA may be disposed in a space formed by bending the second active area AA_2 and the third active area AA_3 of the display panel PNL to overlap the first active area AA_1 in the third direction DR3. Due to the configuration as described above, the display device 1 may secure an internal space as much as possible with minimizing a thickness generated by bending the display panel PNL.

A driving circuit DC and a circuit board CB may be disposed on a surface of the sub-area SBA in the third direction DR3.

The circuit board CB may be attached onto an upper surface of the sub-area SBA by using an anisotropic conductive film (ACF). The circuit board CB may be electrically connected to pad parts formed on the sub-area SBA.

The circuit board CB may be a flexible printed circuit board, a printed circuit board, or a flexible film such as a chip on film.

The driving circuit DC may be formed as an integrated circuit (IC) and be adhered onto the sub-area SBA in a chip on glass (COG) manner, a chip on plastic (COP) manner, or an ultrasonic manner. In another example, the driving circuit DC may be adhered onto the circuit board CB.

The panel support SM of the display module DM may function to support a lower surface of the display panel PNL. The panel support SM may be attached to the lower surface of the display panel PNL to support the display panel PNL.

An adhesive ADH may be interposed between the panel support SM and the display panel PNL. In some embodiments, the adhesive ADH may be a pressure sensitive adhesive (PSA), but embodiments are not limited thereto. The panel support SM may include a main plate MP, a first sub-plate SP_1, a second sub-plate SP_2, and segments SG.

The main plate MP may function to support the first active area AA_1 of the display panel PNL. For example, the main plate MP may support not only the first active area AA_1 of the display panel PNL but also a portion of the non-active area NAA surrounding the first active area AA_1. The main plate MP may be disposed between segments SG supporting the second active area AA_2 and segments SG supporting the third active area AA_3. The main plate MP and the first active area AA_1 of the display panel PNL may overlap each other in the third direction DR3.

The main plate MP may have a planar shape in which the main plate MP extends in the first direction DR1 and the second direction DR2. For example, the main plate MP may have a substantially flat shape in plan view. The main plate MP may have the same width in the third direction DR3 along a profile of the first active area AA_1 of the display panel PNL.

A surface of the main plate MP in the third direction DR3 may be an upper surface to which the first active area AA_1 of the display panel PNL is attached, and another surface of the main plate MP in the third direction DR3 may be a lower surface on which an air gap to be described below is disposed.

The segments SG may function to support the second active area AA_2 and the third active area AA_3 of the display panel PNL. For example, the segments SG may support not only the second active area AA_2 and the third active area AA_3 of the display panel PNL but also portions of the non-active area NAA surrounding the second active area AA_2 and the third active area AA_3. The segments SG may be disposed on sides (e.g., opposite sides) of the main plate MP in the first direction DR1.

The segments SG may extend in the second direction DR2, and may be arranged to be spaced apart from each other in the first direction DR1. Each of the segments SG may have a width in the second direction DR2 greater than a width of the display panel PNL in the second direction DR2, and may thus protrude from the display panel PNL in the second direction DR2. For example, each of the segments SG may include protrusion areas PTA that are not covered by the display panel PNL as illustrated in FIGS. 3 and 4. The protrusion areas PTA of each of the segments SG may be engaged with guide rails GR1 and GR2 formed in the panel storage container SD (see FIG. 7). A detailed description thereof will be provided below.

A width of each of the segments SG in the third direction DR3 may be greater than a thickness of the main plate MP. Accordingly, an air gap may be formed below the main plate MP as illustrated in FIG. 5. The air gap may be formed below the main plate MP, and may thus alleviate an impact applied to the display panel PNL. For example, the air gap may absorb an impact in case that an object such as a pen of a user falls in the first active area AA_1 of the display panel PNL.

The first sub-plate SP_1 may support a portion of the non-active area NAA disposed at an end portion of the second active area AA_2 in the first direction DR1, and the second sub-plate SP_2 may support a portion of the non-active area NAA disposed at another end portion of the third active area AA_3 in the first direction DR1. Each of the first sub-plate SP_1 and the second sub-plate SP_2 may substantially extend in the second direction DR2, but may have a width greater than a width of each of the segments SG in the first direction DR1.

Each of the first sub-plate SP_1 and the second sub-plate SP_2 may have a width in the second direction DR2 greater than the width of the display panel PNL in the second direction DR2, and may thus protrude from the display panel PNL in the second direction DR2. For example, each of the first sub-plate SP_1 and the second sub-plate SP_2 may include protrusion areas PTA that are not covered by the display panel PNL as illustrated in FIGS. 3 and 4. The protrusion areas PTA of each of the first sub-plate SP_1 and the second sub-plate SP_2 may be engaged with guide rails GR1 and GR2 formed in the panel storage container SD (see FIGS. 8 and 10). A detailed description thereof will be provided below.

The main plate MP, the first sub-plate SP_1, the second sub-plate SP_2, and the segments SG may have substantially the same relative position relationship with respect to the display panel PNL. In case that the display panel PNL is unbent to be flat without a bend, at least one plane substantially parallel to the display panel PNL may simultaneously pass through the main plate MP, the first sub-plate SP_1, the second sub-plate SP_2, and the segments SG.

As illustrated in FIGS. 1A and 1B, the panel storage container SD may function to store at least a portion of the display panel PNL and assist a sliding operation of the display device 1. The panel storage container SD may include a first storage container SD_1 positioned at the center of the display device 1, a second storage container SD_2 disposed on a side (e.g., left side) of the first storage container SD_1 in the first direction DR1 and including the first bent area RA_1, and a third storage container SD_3 disposed on another side (e.g., right side) of the first storage container SD_1 in the first direction DR1 and including the second bent area RA_2. The first storage container SD_1 may connect the second storage container SD_2 and the third storage container SD_3 to each other. For example, the first storage container SD_1 may include a first sidewall part SD_1a connecting another side (e.g., rear lateral side) of the second storage container SD_2 in the second direction DR2 and another side (e.g., rear lateral side) of the third storage container SD_3 in the second direction DR2 to each other and a second sidewall part SD_1b connecting a side (e.g., front lateral side) of the second storage container SD_2 in the second direction DR2 and a side (e.g., front lateral side) of the third storage container SD_3 in the second direction DR2 to each other.

First and second guide rails GR1 and GR2 may be formed inside the second and third storage containers SD_2 and SD_3, respectively, to guide a sliding operation of the display module DM.

In case that the display device 1 according to an embodiment is the single slidable display device slid in only a direction as illustrated in FIGS. 2A and 2B, the second bent area RA_2 and the third storage container SD_3 illustrated in FIGS. 1A and 1B may be omitted.

Hereinafter, it will be described that the second storage container SD_2 and the third storage container SD_3 of the panel storage container SD guide a sliding operation of the display module DM.

Figure 6A:
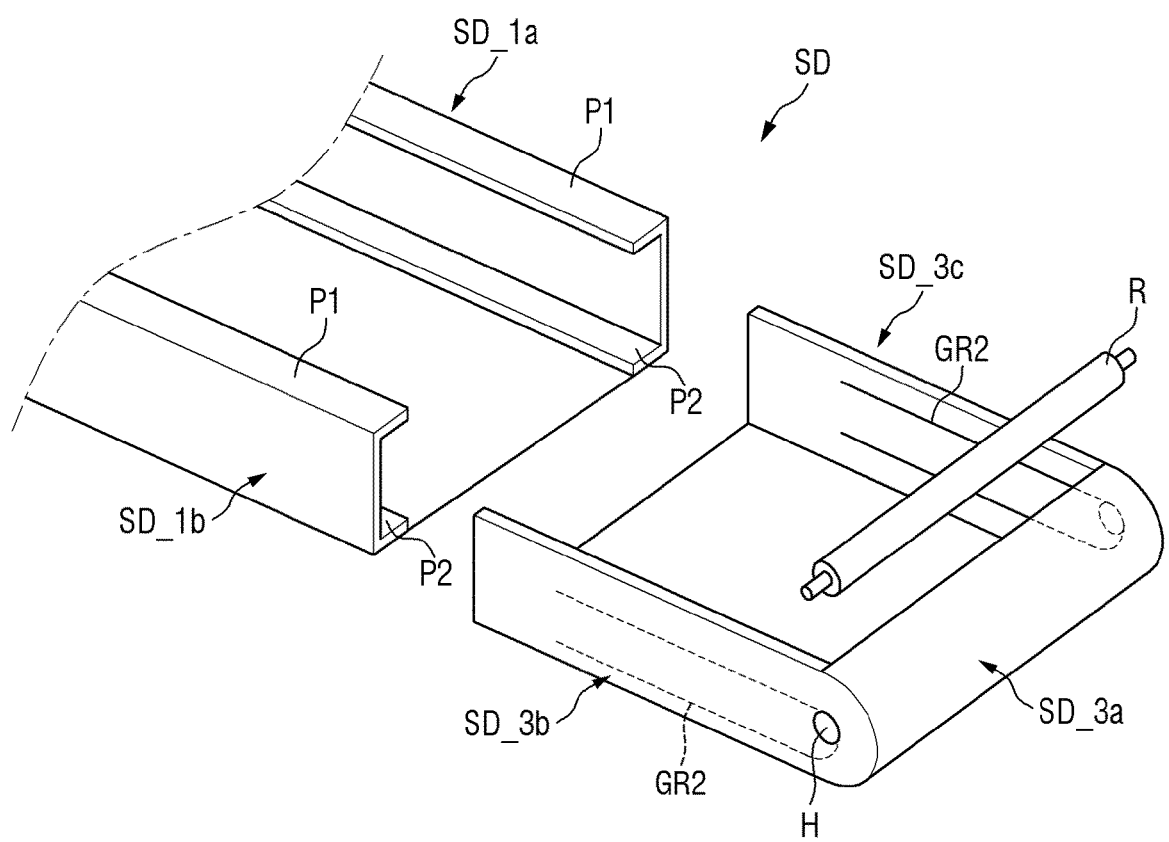
FIG. 6A is a schematic exploded perspective view of a panel storage container of the display device according to an embodiment.
Figure 6B:
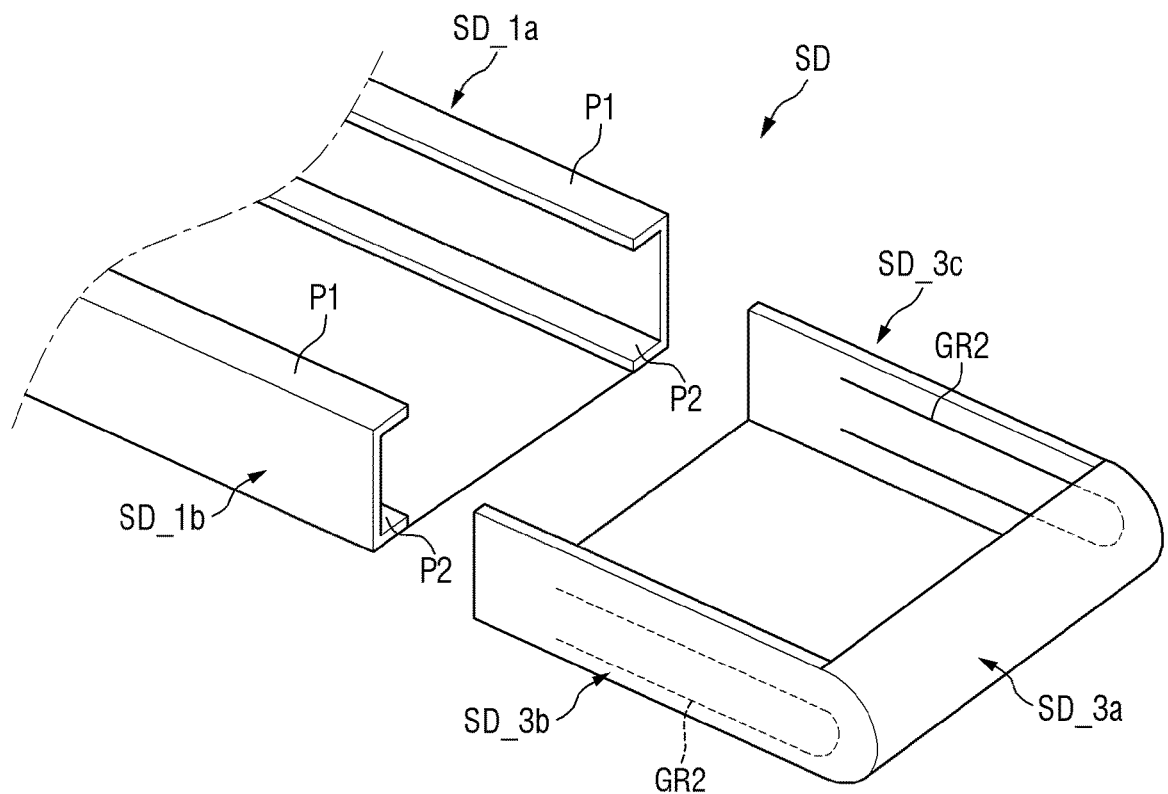
FIG. 6B is a schematic exploded perspective view of another example of the panel storage container of the display device according to an embodiment.
Figure 7:
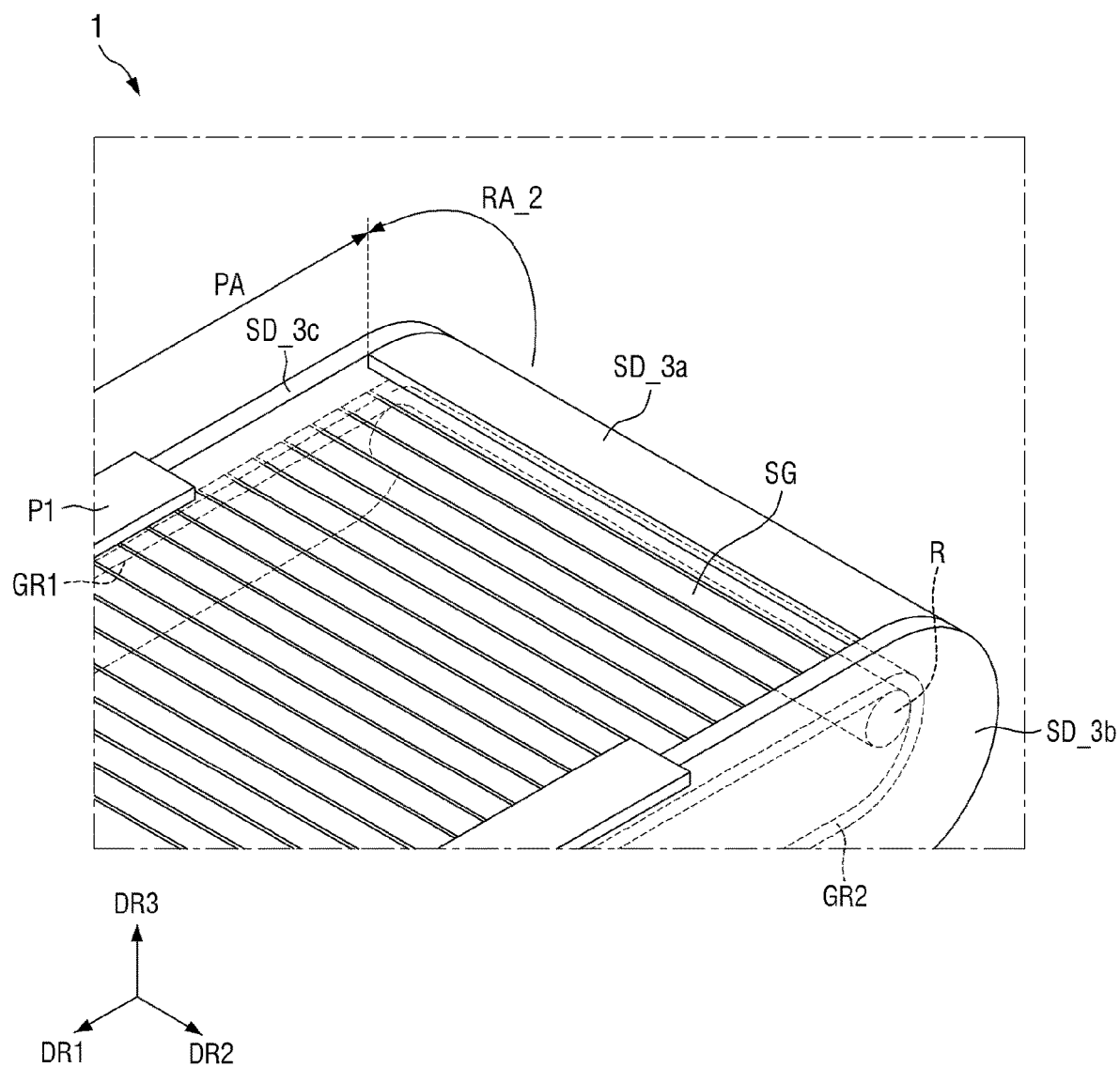
FIG. 7 is a schematic perspective view illustrating a structure in which the panel storage container and the display module are coupled to each other according to an embodiment of FIG. 6A.

FIG. 6A is a schematic exploded perspective view of a panel storage container SD of the display device 1 according to an embodiment. FIG. 6B is a schematic exploded perspective view of another example of the panel storage container SD of the display device 1 according to an embodiment. FIG. 7 is a schematic perspective view illustrating a structure in which the panel storage container SD and the display module DM are coupled to each other according to an embodiment of FIG. 6A.

Referring to FIGS. 6A, 6B, and 7 in conjunction with FIGS. 1A and 1B, the panel storage container SD may function to store at least portions of the display panel PNL and the panel support SM and guide a sliding operation of the display device 1. The panel storage container SD may include a first storage container SD_1 positioned at the center of the display device 1, a second storage container SD_2 disposed on a side (e.g., left side) of the first storage container SD_1 in the first direction DR1 and bending the second active area AA_2 of the display panel PNL, and a third storage container SD_3 disposed on another side (e.g., right side) of the first storage container SD_1 in the first direction DR1 and bending the third active area AA_3 of the display panel PNL. The first storage container SD_1 may connect the second storage container SD_2 and the third storage container SD_3 to each other. Guide rails GR1 and GR2 may be formed inside the second storage container SD_2 and the third storage container SD_3 to guide a sliding operation of the display panel PNL.

For example, referring to FIG. 6A, the first storage container SD_1 may include a first sidewall part SD_1a on a side (e.g., rear lateral side) in the second direction DR2 and a second sidewall part SD_1b on another side (e.g., front lateral side) in the second direction DR2. An area exposing a portion of the display panel PNL may be formed between the first sidewall part SD_1a and the second sidewall part SD_1b. Fixing parts P1 and P2 protruding in the second direction DR2, e.g., in a direction toward an inner portion of the first storage container SD_1 may be formed at end portions (e.g., opposite end portions) of each of the first sidewall part SD_1a and the second sidewall part SD_1b in the third direction DR3. For example, a first fixing part P1 may be formed at an end portion of each of the first sidewall part SD_1a and the second sidewall part SD_1b in the third direction DR3, and a second fixing part P2 may be formed at another end portion of each of the first sidewall part SD_1a and the second sidewall part SD_1b in the third direction DR3. The first fixing part P1 and the second fixing part P2 may face each other in the third direction DR3. Accordingly, the third storage container SD_3 may be engaged with and slid in a space formed between the first fixing part P1 and the second fixing part P2. Since sliding movements of the second storage container SD_2 and the third storage container SD_3 are the same as each other, the third storage container SD_3 will hereinafter be described, and a detailed description of the second storage container SD_2 will be omitted for descriptive convenience.

The third storage container SD_3 may include guide parts SD_3b and SD_3c on sides (e.g., opposite sides) of the second direction DR2. For example, the third storage container SD_3 may include a first guide part SD_3b on a side (e.g., front lateral side) in the second direction DR2 and a second guide part SD_3c on another side (e.g., rear lateral side) in the second direction DR2. The guide parts SD_3b and SD_3c may have a flat plate shape having a plane defined in the first direction DR1 and the third direction DR3. The guide parts SD_3b and SD_3c may be engaged with the first fixing part P1 and the second fixing part P2 formed in each of the first sidewall part SD_1a and the second sidewall part SD_1b of the first storage container SD_1 to be slid in the first direction DR1.

The second guide rails GR2 with which the protrusion areas PTA of the segments SG are engaged may be formed in the first guide part SD_3b and the second guide part SD_3c of the third storage container SD_3. The second guide rail GR2 may define a trajectory on which the display module DM is slid. The second guide rails GR2 may be grooves grooved in each of the first guide part SD_3b and the second guide part SD_3c, and may be formed to be engaged with the protrusion areas PTA of each of the segments SG, as illustrated in FIG. 7. The second guide rail GR2 may substantially have a U-shaped shape rotated by 90° in a counterclockwise direction. For example, the second guide rail GR2 may substantially have a convex shape toward a side surface of the third storage container SD_3, e.g., toward another side (e.g., right side) in the first direction DR1. For example, the second guide rail GR2 may extend in the first direction DR1, is bent to another side (e.g., lower side) in the third direction DR3 in an area in which the display module DM is bent, and extends again in the first direction DR1. A portion where the second guide rail GR2 is bent may be bent at different curvatures. A detailed description thereof will be provided below.

A hole H for disposing a roller R to be described below, may be formed in one area of the guide part in which a bent section of the second guide rail GR2 is formed. The second guide rail GR2 may surround the hole H.

The third storage container SD_3 may include a cover part SD_3a connecting the first guide part SD_3b and the second guide part SD_3c to each other. The cover part SD_3a may function to prevent a bent portion of the display module DM from being viewed from the outside.

For example, the panel storage container SD may further include a roller R. The roller R may function to assist sliding behavior of the display panel PNL. The roller R may have a cylindrical shape whose cross section is circular. The roller R may be inserted into and fixed to the holes H formed in the guide parts SD_3b and SD_3c. However, embodiments are not limited thereto, and the roller R and the holes H illustrated in FIG. 6A may be omitted as illustrated in FIG. 6B. For convenience of explanation, it will be described that the display device 1 according to an embodiment includes the roller R and the holes H.

Hereinafter, a shape of the first guide rail GR1 formed in the second storage container SD_2 and a shape of the second guide rail GR2 formed in the third storage container SD_3 will be described.

Figure 8:
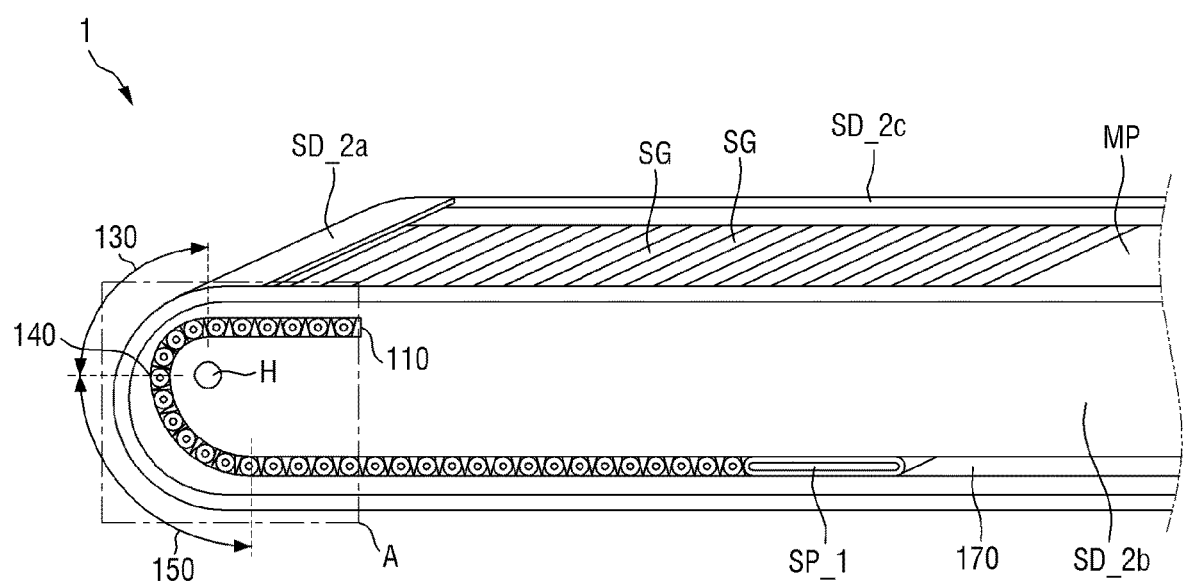
FIG. 8 is a schematic perspective view illustrating a coupling relationship between a second storage container of the panel storage container and the display module according to an embodiment.
Figure 9:
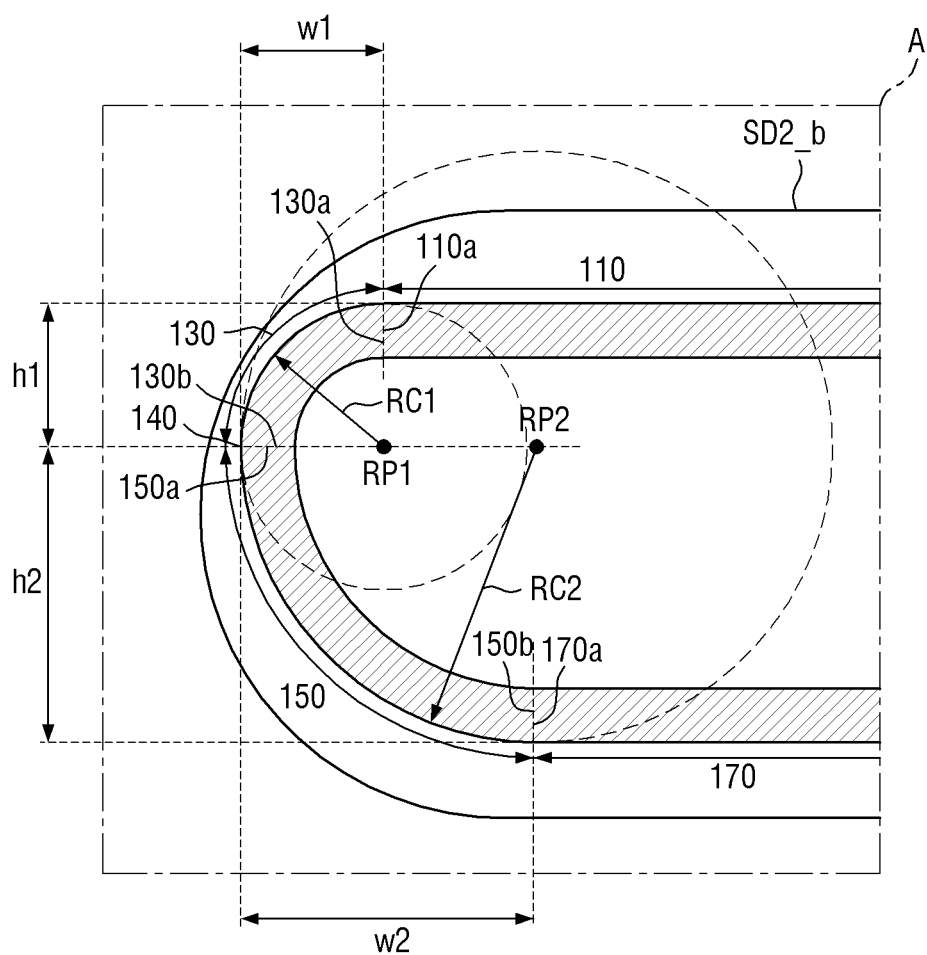
FIG. 9 is a schematic enlarged view of area A of FIG. 8.
Figure 9:
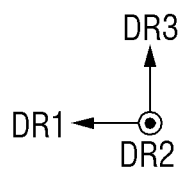
Figure 10:
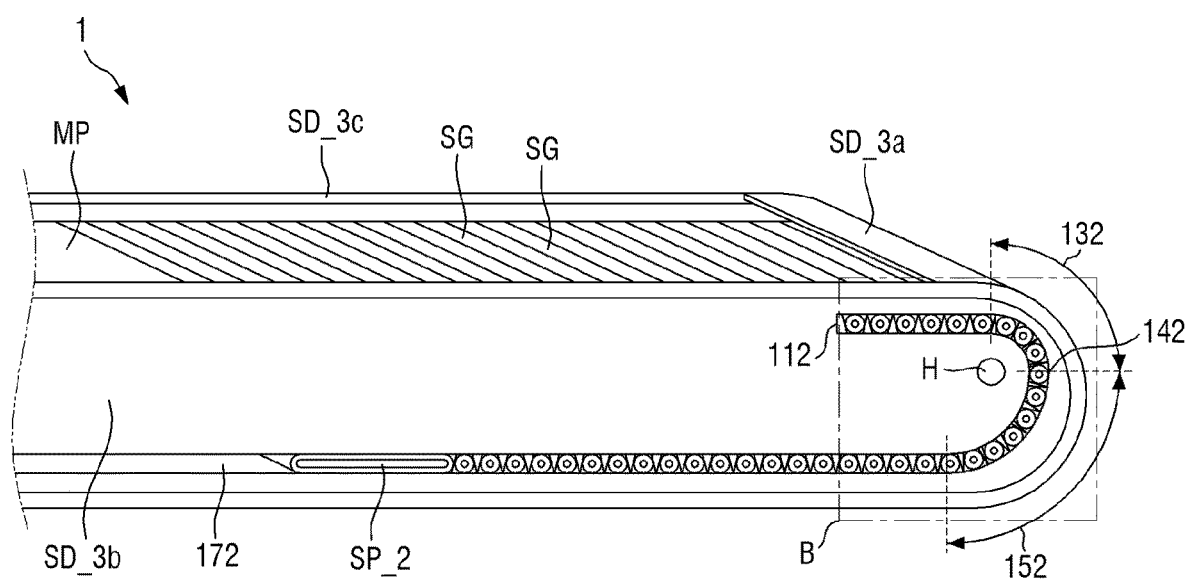
FIG. 10 is a schematic perspective view illustrating a coupling relationship between a third storage container of the panel storage container and the display module according to an embodiment.
Figure 11:
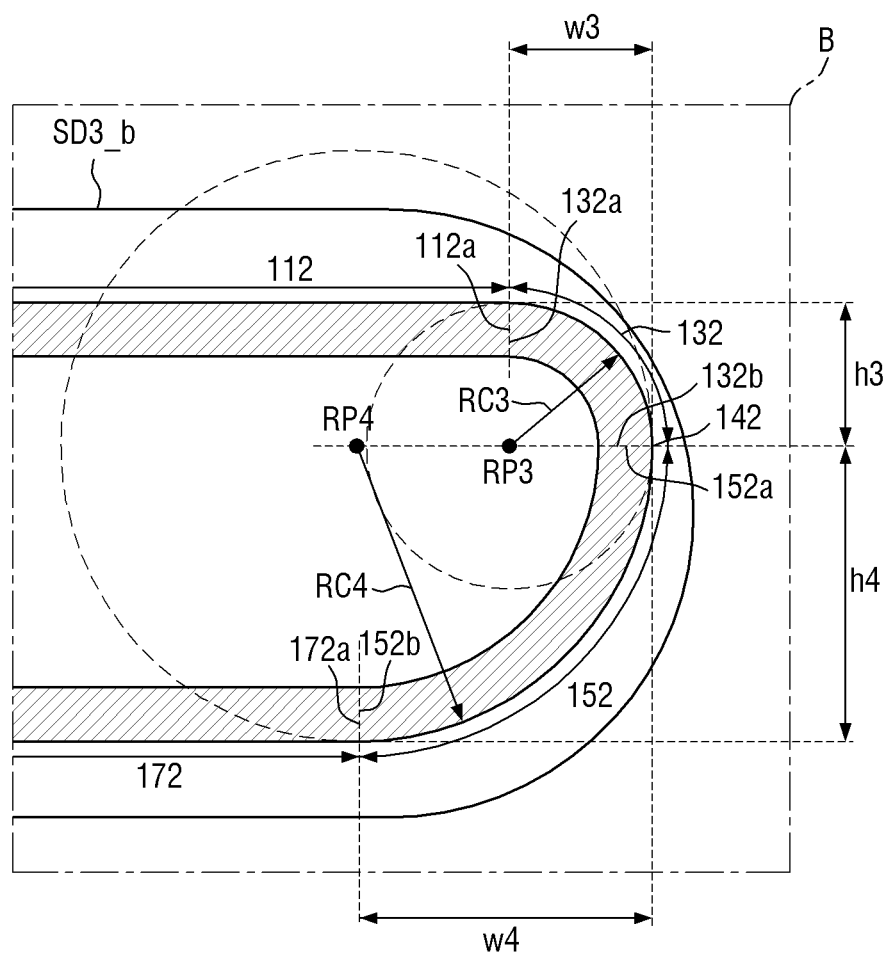
FIG. 11 is a schematic enlarged view of area B of FIG. 10.
Figure 11:
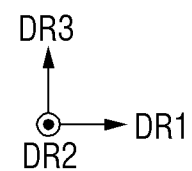

FIG. 8 is a schematic perspective view illustrating a coupling relationship between a second storage container SD_2 of the panel storage container SD and the display module DM according to an embodiment. FIG. 9 is a schematic enlarged view of area A of FIG. 8. FIG. 10 is a schematic perspective view illustrating a coupling relationship between a third storage container SD_3 of the panel storage container SD and the display module DM according to an embodiment. FIG. 11 is a schematic enlarged view of area B of FIG. 10.

Referring to FIGS. 8 and 9, the second storage container SD_2 of the display device 1 according to an embodiment may include a first guide part SD_2b, a second guide part SD_2c, and a cover part SD_2a. A description of the first guide part SD_2b, the second guide part SD_2c, and the cover part SD_2a of the second storage container SD_2 is substantially the same as that of the first guide part SD_3b, the second guide part SD_3c, and the cover part SD_3a of the third storage container SD_3 described above, and will thus be omitted for descriptive convenience. The first guide rails GR1 may be formed in the first guide part SD_2b and the second guide part SD_2c of the second storage container SD_2. The first guide rail GR1 may include a first flat portion 110, a bent portion, and a second flat portion 170.

For example, the first guide rail GR1 may be formed on another surface of the first guide part SD_2b in the second direction DR2 and thus, may not be viewed from the outside, but in FIG. 8, the first guide rail GR1 has been illustrated to be viewed from the first guide part SD_2b of the second storage container SD_2 for convenience of explanation, and in FIG. 9, the segments SG coupled to the first guide rail GR1 have been omitted for convenience of explanation.

The first flat portion 110 of the first guide rail GR1 may function to expose at least a portion of the second active area AA_2 to the outside by guiding sliding behavior of the display device 1 according to an embodiment so that the flat area PA may be extended. The first flat portion 110 may be disposed on a side (e.g., upper side) of the first guide part SD_2b in the third direction DR3, and may extend in the first direction DR1.

The segments SG engaged with the first flat portion 110 may be disposed to extend side by side in the first direction DR1 along (or corresponding to) the shape of the first flat portion 110. Accordingly, at least a portion of the second active area AA_2 may be supported in a flat state in which it is flatly unbent by the segments SG in the second storage container SD_2 and be exposed to the outside.

The second flat portion 170 of the first guide rail GR1 may function to guide the sliding behavior of the display device 1 so that the display module DM may be flatly stored according to the sliding behavior of the display device 1 according to an embodiment. The second flat portion 170 may be disposed on another side (e.g., lower side) of the first guide part SD_2b in the third direction DR3, and may extend in the first direction DR1.

The segments SG engaged with the second flat portion 170 may be disposed to extend side by side in the first direction DR1 along (or corresponding to) the shape of the second flat portion 170. The first sub-plate SP_1 may be engaged with the second flat portion 170. Accordingly, at least a portion of the second active area AA_2 may be stored in the second storage container SD_2 in a flat state in which it is flatly unbent by the segments SG.

The bent portion of the first guide rail GR1 may be convexly bent toward a side surface of the second storage container SD_2, e.g., a side (e.g., left side) in the first direction DR1, as a whole, and may connect the first flat portion 110 and the second flat portion 170 to each other. Since each of the segments SG is disposed along (or corresponding to) the shape of the bent portion, at least a portion of the second active area AA_2 may have a bent state in which it is bent by the segments SG. The bent portion may include a first bent portion 130, a second bent portion 150, and an orientation change portion 140.

The first bent portion 130 of the bent portion may be formed to decrease a force acting (or pressing) on the segments SG disposed on a side (e.g., upper side) of the second storage container SD_2 in the third direction DR3 (see FIG. 15) in case that the display device 1 according to an embodiment is slid to be contracted (or reduced) as described below. A detailed description thereof will be provided below.

An end portion 130a of the first bent portion 130 may be connected to an end portion 110a of the first flat portion 110, and another end portion 130b of the first bent portion 130 may be connected to an end portion 150a of the second bent portion 150. The first bent portion 130 may be bent at a first radius of curvature RC1 based on a first bending center RP1 positioned inside the first guide part SD_2b of the second storage container SD_2. For example, the first bent portion 130 may have an arc shape (or curved shape) formed by rotating the first radius of curvature RC1 at an angle of 90° based on the first bending center RP1 in FIG. 9. For example, the first bent portion 130 may have an arc shape (or curved shape) corresponding to ¼ of a virtual circle having the first bending center RP1 as a center and having the first radius of curvature RC1 as a radius. For example, a straight line passing through the first bending center RP1 and substantially parallel to the third direction DR3 may pass through a point where an end portion 130a of the first bent portion 130 and an end portion 110a of the first flat portion 110 are in contact with each other.

The second bent portion 150 of the bent portion may be formed to increase a force acting (or pressing) on the segments SG disposed on another side (e.g., lower side) of the second storage container SD_2 in the third direction DR3 (see FIG. 15) in case that the display device 1 according to an embodiment is slid to be contracted (or reduced) as described below. A detailed description thereof will be provided below.

An end portion 150a of the second bent portion 150 may be connected to another end portion 130b of the first bent portion 130, and another end portion 150b of the second bent portion 150 may be connected to an end portion 170a of the second flat portion 170. The second bent portion 150 may be bent at a second radius of curvature RC2 greater than the first radius of curvature RC1, based on a second bending center RP2 positioned inside the first guide part SD_2b of the second storage container SD_2. For example, the second bent portion 150 may have an arc shape (or curved shape) formed by rotating the second radius of curvature RC2 at an angle of 90° based on the second bending center RP2 in FIG. 9. For example, the second bent portion 150 may have an arc shape (or curved shape) corresponding to ¼ of a virtual circle having the second bending center RP2 as a center and having the second radius of curvature RC2 as a radius. For example, a straight line passing through the second bending center RP2 and substantially parallel to the third direction DR3 may pass through a point where another end portion 150b of the second bent portion 150 and an end portion 170a of the second flat portion 170 are in contact with each other.

Since the second bent portion 150 is bent at the second radius of curvature RC2 greater than the first radius of curvature RC1, a length of an arc formed by the second bent portion 150 may be greater than a length of an arc formed by the first bent portion 130. Accordingly, as illustrated in FIG. 8, the number of segments SG engaged with the first bent portion 130 may be less than the number of segments SG engaged with the second bent portion 150.

The orientation change portion 140 may be defined as a boundary area between the first bent portion 130 and the second bent portion 150. For example, the orientation change portion 140 may be a portion where another end portion 130b of the first bent portion 130 and an end portion 150a of the second bent portion 150 are in contact with each other.

An orientation of an upper surface of the display panel PNL may be changed on the basis of the orientation change portion 140. As described above, the pixels PX may be disposed on the upper surface of the display panel PNL, and the panel support SM may be attached to the lower surface of the display panel PNL. The orientation of the upper surface of the display panel PNL may be between a side (e.g., left side) in the first direction DR1 and a side (e.g., upper side) in the third direction DR3 in case that the upper surface of the display panel PNL moves (or is disposed) along the first bent portion 130. For example, the orientation of the upper surface of the display panel PNL may be substantially toward a side (e.g., upper side) in the third direction DR3, e.g., an upper surface of the second storage container SD_2. For example, the orientation of the upper surface of the display panel PNL may be between a side (e.g., left side) in the first direction DR1 and another side (e.g., lower side) in the third direction DR3 in case that the upper surface of the display panel PNL moves (or is disposed) along the second bent portion 150. For example, the orientation of the upper surface of the display panel PNL may be substantially toward another side (e.g., lower side) in the third direction DR3, e.g., a lower surface of the second storage container SD_2. The orientation of the upper surface of the display panel PNL may be substantially parallel to the first direction DR1 in case that the upper surface of the display panel PNL faces the orientation change portion 140. For example, on the basis of the orientation change portion 140, the display panel PNL disposed on a side (e.g., upper side) of the orientation change portion 140 in the third direction DR3 may substantially have an orientation toward a side (e.g., upper side) in the third direction DR3, and the display panel PNL disposed on another side (e.g., lower side) of the orientation change portion 140 in the third direction DR3 may substantially have an orientation toward another side (e.g., lower side) in the third direction DR3.

The shortest distance w1 between a straight line passing through the orientation change portion 140 and substantially parallel to the third direction DR3 and a straight line passing through a boundary area between the first bent portion 130 and the first flat portion 110 may be smaller than the shortest distance w2 between the straight line passing through the orientation change portion 140 and substantially parallel to the third direction DR3 and a straight line passing through a boundary area between the second bent portion 150 and the second flat portion 170. Accordingly, the straight line passing through the boundary area between the first bent portion 130 and the first flat portion 110 may overlap a portion of the second bent portion 150 in the third direction DR3, and the straight line passing through the boundary area between the second bent portion 150 and the second flat portion 170 may overlap the first flat portion 110 in the third direction DR3. The shortest distance w1 between the straight line passing through the orientation change portion 140 and substantially parallel to the third direction DR3 and the straight line passing through the boundary area between the first bent portion 130 and the first flat portion 110 may be the same as the first radius of curvature RC1, and the shortest distance w2 between the straight line passing through the orientation change portion 140 and substantially parallel to the third direction DR3 and the straight line passing through the boundary area between the second bent portion 150 and the second flat portion 170 may be the same as the second radius of curvature RC2.

The orientation change portion 140 may be disposed more adjacent (or closer) to the first flat portion 110 than to the second flat portion 170. For example, the shortest distance h1 between a straight line passing through the orientation change portion 140 and substantially parallel to the first direction DR1 and a straight line passing through a side (e.g., upper side) of the first flat portion 110 in the third direction DR3 and substantially parallel to the first direction DR1 may be smaller than the shortest distance h2 between the straight line passing through the orientation change portion 140 and parallel to the first direction DR1 and a straight line passing through another side (e.g., lower side) of the second flat portion 170 in the third direction DR3 and substantially parallel to the first direction DR1.

A straight line passing through the second bending center RP2 and the first bending center RP1 may be substantially parallel to the first direction DR1, and may pass through a portion where another end portion 130b of the first bent portion 130 and an end portion 150a of the second bent portion 150 are in contact with each other, e.g., the orientation change portion 140. A hole H in which the roller R is disposed may be disposed on a straight line passing through the second bending center RP2 and the first bending center RP1. The second bending center RP2 may be disposed on another side (e.g., right side) of the first bending center RP1 in the first direction DR1. Accordingly, a tangent line passing through another end portion 130b of the first bent portion 130 may be substantially parallel to the third direction DR3, and a tangent line passing through an end portion 150a of the second bent portion 150 may be substantially parallel to the third direction DR3 like the tangent line passing through another end portion 130b of the first bent portion 130.

Due to the configuration as described above, even though the first bent portion 130 and the second bent portion 150 have different radii of curvature, the first bent portion 130 and the second bent portion 150 may be smoothly connected to each other such that the segments SG may be arranged without difficulty.

Referring to FIGS. 10 and 11, as described above, the third storage container SD_3 of the display device 1 according to an embodiment may include the first guide part SD_3b, the second guide part SD_3c, and the cover part SD_3a. The second guide rails GR2 may be formed in the first guide part SD_3b and the second guide part SD_3c of the third storage container SD_3. The second guide rail GR2 may include a first flat portion 112, a bent portion, and a second flat portion 172.

For example, the second guide rail GR2 may be formed on another surface of the first guide part SD_3b in the second direction DR2 and thus, may not be viewed from the outside, but in FIG. 10, the second guide rail GR2 has been illustrated to be viewed from the first guide part SD_3b of the third storage container SD_3 for convenience of explanation, and in FIG. 11, the segments SG coupled to the second guide rail GR2 have been omitted for convenience of explanation. The second guide rail GR2 may be symmetrical to the first guide rail GR1 in the first direction DR1.

The first flat portion 112 of the second guide rail GR2 may function to expose at least a portion of the third active area AA_3 to the outside by guiding sliding behavior of the display device 1 according to an embodiment so that the flat area PA may be extended. The first flat portion 112 may be disposed on a side (e.g., upper side) of the first guide part SD_3b in the third direction DR3, and may extend in the first direction DR1.

The segments SG engaged with the first flat portion 112 may be disposed to extend side by side in the first direction DR1 along (or corresponding to) the shape of the first flat portion 112. Accordingly, at least a portion of the third active area AA_3 may be supported in a flat state in which it is flatly unbent by the segments SG in the third storage container SD_3 and be exposed to the outside.

The second flat portion 172 of the second guide rail GR2 may function to guide the sliding behavior of the display device 1 so that the display module DM may be flatly stored according to the sliding behavior of the display device 1 according to an embodiment. The second flat portion 172 may be disposed on another side (e.g., lower side) of the first guide part SD_3b in the third direction DR3, and may extend in the first direction DR1.

The segments SG engaged with the second flat portion 172 may be disposed to extend side by side in the first direction DR1 along (or corresponding to) the shape of the second flat portion 172. The second sub-plate SP_2 may be engaged with the second flat portion 172. Accordingly, at least a portion of the third active area AA_3 may be stored in the third storage container SD_3 in a flat state in which it is flatly unbent by the segments SG.

The bent portion of the second guide rail GR2 may be convexly bent toward another side (e.g., right side) in the first direction DR1 as a whole, and may connect the first flat portion 112 and the second flat portion 172 to each other. Since each of the segments SG is disposed along (or corresponding to) the shape of the bent portion, at least a portion of the third active area AA_3 may have a bent state in which it is bent by the segments SG. The bent portion may include a first bent portion 132, a second bent portion 152, and an orientation change portion 142.

The first bent portion 132 of the bent portion may be formed to decrease a force acting (or pressing) on the segments SG disposed on a side (e.g., upper side) of the third storage container SD_3 in the third direction DR3 in case that the display device 1 according to an embodiment is slid to be contracted (or reduced) as described below. A detailed description thereof will be provided below.

An end portion 132a of the first bent portion 132 may be connected to an end portion 112a of the first flat portion 112, and another end portion 132b of the first bent portion 132 may be connected to an end portion 152a of the second bent portion 152. The first bent portion 132 may be bent at a third radius of curvature RC3 based on a third bending center RP3 positioned inside the first guide part SD_3b of the third storage container SD_3. For example, the first bent portion 132 may have an arc shape (or curved shape) formed by rotating the third radius of curvature RC3 at an angle of 90° based on the third bending center RP3 in FIG. 11. For example, the first bent portion 132 may have an arc shape (or curved shape) corresponding to ¼ of a virtual circle having the third bending center RP3 as a center and having the third radius of curvature RC3 as a radius. For example, a straight line passing through the third bending center RP3 and substantially parallel to the third direction DR3 may pass through a point where an end portion 132a of the first bent portion 132 and an end portion 112a of the first flat portion 112 are in contact with each other. In some embodiments, the first radius of curvature RC1 and the third radius of curvature RC3 may have substantially the same length, but embodiments are not limited thereto.

The second bent portion 152 of the bent portion may be formed to increase a force acting (or pressing) on the segments SG disposed on another side (e.g., lower side) of the third storage container SD_3 in the third direction DR3 in case that the display device 1 according to an embodiment is slid to be contracted (or reduced) as described below. A detailed description thereof will be provided below.

An end portion 152a of the second bent portion 152 may be connected to another end portion 132b of the first bent portion 132, and another end portion 152b of the second bent portion 152 may be connected to an end portion 172a of the second flat portion 172. The second bent portion 152 may be bent at a fourth radius of curvature RC4 greater than the third radius of curvature RC3, based on a fourth bending center RP4 positioned inside the first guide part SD_3b of the third storage container SD_3. For example, the second bent portion 152 may have an arc shape (or curved shape) formed by rotating the fourth radius of curvature RC4 at an angle of 90° based on the fourth bending center RP4 in FIG. 11. For example, the second bent portion 152 may have an arc shape (or curved shape) corresponding to ¼ of a virtual circle having the fourth bending center RP4 as a center and having the fourth radius of curvature RC4 as a radius. For example, a straight line passing through the fourth bending center RP4 and substantially parallel to the third direction DR3 may pass through a point where another end portion 152b of the second bent portion 152 and an end portion 172a of the second flat portion 172 are in contact with each other. In some embodiments, the fourth radius of curvature RC4 may have substantially the same length as the second radius of curvature RC2, but embodiments are not limited thereto.

Since the second bent portion 152 is bent at the fourth radius of curvature RC4 greater than the third radius of curvature RC3, a length of an arc formed by the second bent portion 152 may be greater than a length of an arc formed by the first bent portion 132. Accordingly, as illustrated in FIG. 10, the number of segments SG engaged with the first bent portion 132 may be less than the number of segments SG engaged with the second bent portion 152.

The orientation change portion 142 may be defined as a boundary area between the first bent portion 132 and the second bent portion 152. For example, the orientation change portion 142 may be a portion where another end portion 132b of the first bent portion 132 and an end portion 152a of the second bent portion 152 are in contact with each other.

An orientation of an upper surface of the display panel PNL may be changed on the basis of the orientation change portion 142. As described above, the pixels PX may be disposed on the upper surface of the display panel PNL, and the panel support SM may be attached to the lower surface of the display panel PNL. The orientation of the upper surface of the display panel PNL may be between another side (e.g., right side) in the first direction DR1 and a side (e.g., upper side) in the third direction DR3 in case that the upper surface of the display panel PNL moves (or is disposed) along the first bent portion 132. For example, the orientation of the upper surface of the display panel PNL may be substantially toward a side (e.g., upper side) in the third direction DR3, e.g., an upper surface of the second storage container SD_2. For example, the orientation of the upper surface of the display panel PNL may be between another side (e.g., right side) in the first direction DR1 and another side (e.g., lower side) in the third direction DR3 in case that the upper surface of the display panel PNL moves (or is disposed) along the second bent portion 152. For example, the orientation of the upper surface of the display panel PNL may be substantially toward another side (e.g., lower side) in the third direction DR3, e.g., a lower surface of the third storage container SD_3. The orientation of the upper surface of the display panel PNL may be substantially parallel to the first direction DR1 in case that the upper surface of the display panel PNL faces the orientation change portion 142. For example, on the basis of the orientation change portion 142, the display panel PNL disposed on a side (e.g., upper side) of the orientation change portion 142 in the third direction DR3 may substantially have an orientation toward a side (e.g., upper side) in the third direction DR3, and the display panel PNL disposed on another side (e.g., lower side) of the orientation change portion 142 in the third direction DR3 may substantially have an orientation toward another side (e.g., lower side) in the third direction DR3.

The shortest distance w3 between a straight line passing through the orientation change portion 142 and substantially parallel to the third direction DR3 and a straight line passing through a boundary area between the first bent portion 132 and the first flat portion 112 may be smaller than the shortest distance w4 between the straight line passing through the orientation change portion 142 and parallel to the third direction DR3 and a straight line passing through a boundary area between the second bent portion 152 and the second flat portion 172. Accordingly, the straight line passing through the boundary area between the first bent portion 132 and the first flat portion 112 may overlap a portion of the second bent portion 152 in the third direction DR3, and the straight line passing through the boundary area between the second bent portion 152 and the second flat portion 172 may overlap the first flat portion 112 in the third direction DR3. The shortest distance w3 between the straight line passing through the orientation change portion 142 and substantially parallel to the third direction DR3 and the straight line passing through the boundary area between the first bent portion 132 and the first flat portion 112 may be the same as the third radius of curvature RC3. The shortest distance w4 between the straight line passing through the orientation change portion 142 and substantially parallel to the third direction DR3 and the straight line passing through the boundary area between the second bent portion 152 and the second flat portion 172 may be the same as the fourth radius of curvature RC4.

The orientation change portion 142 may be disposed more adjacent (or closer) to the first flat portion 112 than to the second flat portion 172. For example, the shortest distance h3 between a straight line passing through the orientation change portion 142 and substantially parallel to the first direction DR1 and a straight line passing through a side (e.g., upper side) of the first flat portion 112 in the third direction DR3 and substantially parallel to the first direction DR1 may be smaller than the shortest distance h4 between the straight line passing through the orientation change portion 142 and parallel to the first direction DR1 and a straight line passing through another side (e.g., lower side) of the second flat portion 172 in the third direction DR3 and parallel to the first direction DR1.

A straight line passing through the fourth bending center RP4 and the third bending center RP3 may be substantially parallel to the first direction DR1, and may pass through a portion where another end portion 132b of the first bent portion 132 and an end portion 152a of the second bent portion 152 are in contact with each other, e.g., at the orientation change portion 142. The hole H in which the roller R is disposed may be disposed on a straight line passing through the third bending center RP3 and the fourth bending center RP4. The fourth bending center RP4 may be disposed on another side (e.g., left side) of the third bending center RP3 in the first direction DR1. Accordingly, a tangent line passing through another end portion 132b of the first bent portion 132 may be substantially parallel to the third direction DR3, and a tangent line passing through an end portion 152a of the second bent portion 152 may be substantially parallel to the third direction DR3 like the tangent line passing through another end portion 132b of the first bent portion 132.

Due to the configuration as described above, even though the first bent portion 132 and the second bent portion 152 have different radii of curvature, the first bent portion 132 and the second bent portion 152 may be smoothly connected to each other such that the segments SG may be arranged without difficulty.

Hereinafter, sliding behavior of a display device 1 according to a comparative example will be described.

Figure 12:
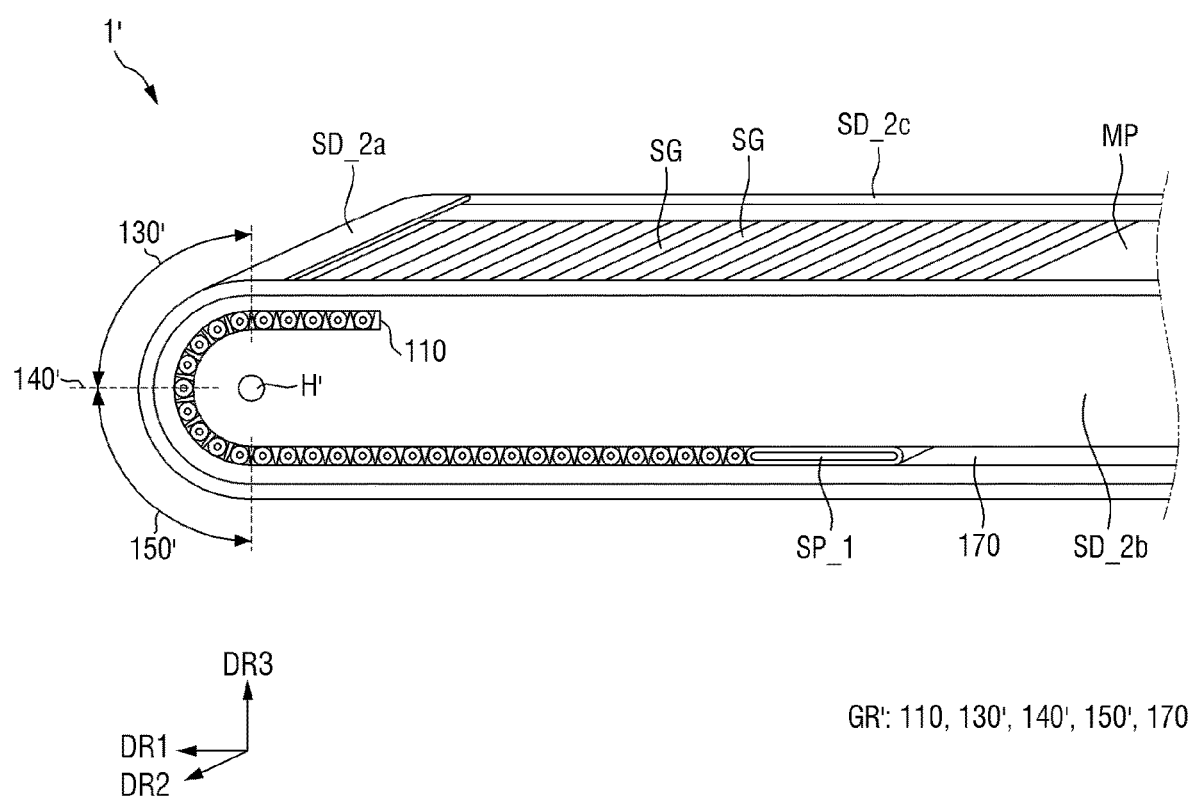
FIG. 12 is a schematic perspective view illustrating a coupling relationship between a second storage container of a panel storage container and a display module of a display device according to a comparative example.
Figure 13:
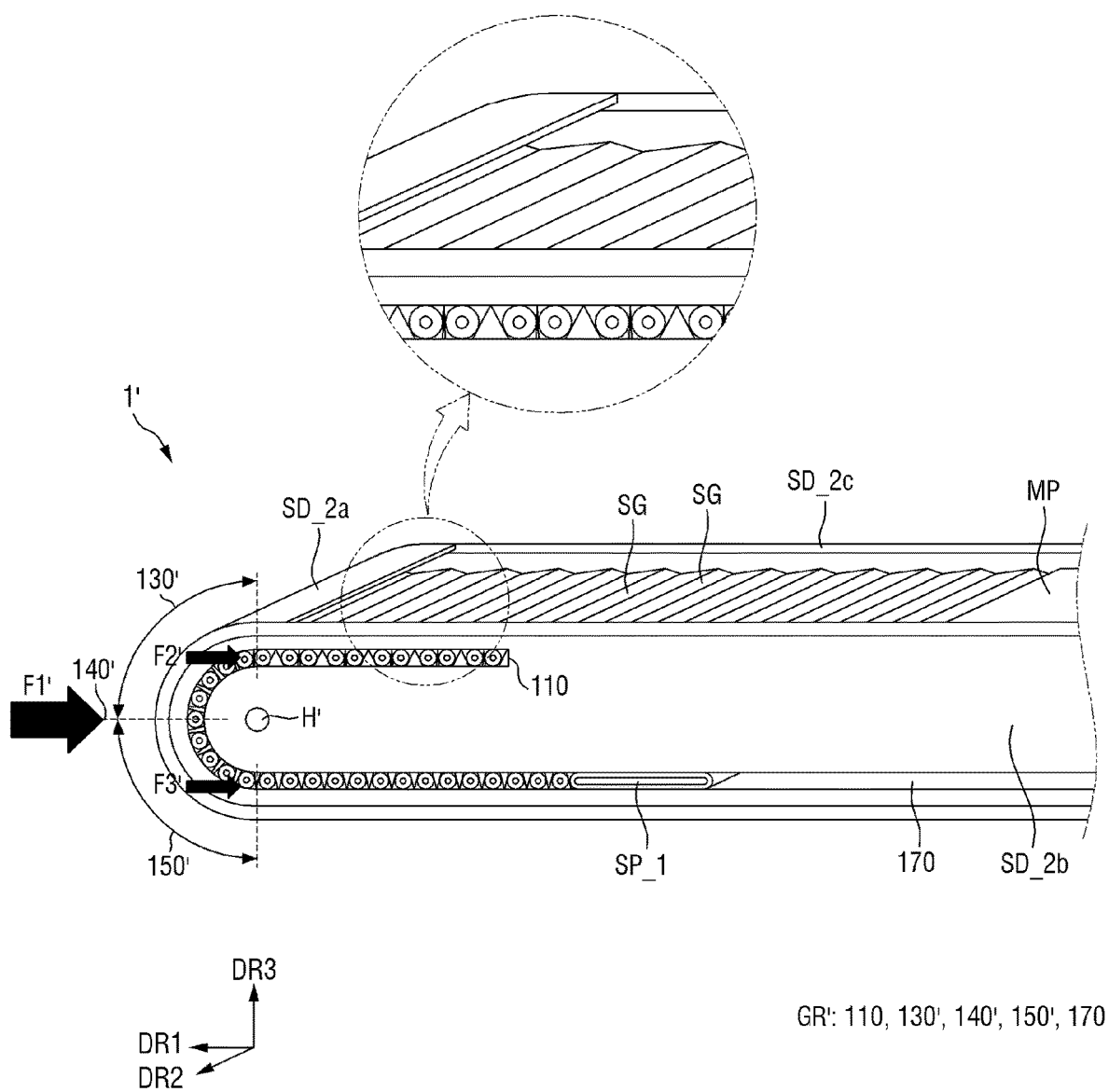
FIG. 13 is a schematic perspective view illustrating a state in which a force is applied in order to slide the second storage container of the panel storage container according to an embodiment of FIG. 12.
Figure 14:
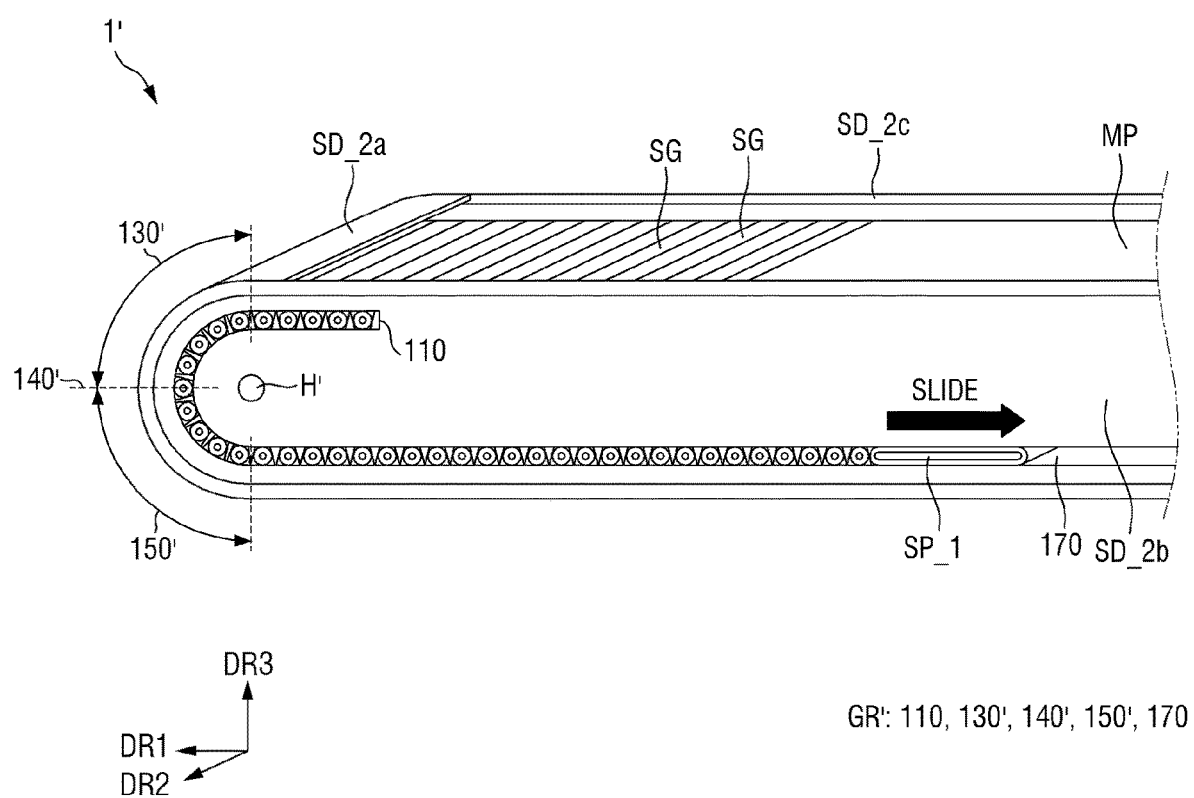
FIG. 14 is a schematic perspective view illustrating a state in which the display device according to an embodiment of FIG. 12 is slid.

FIG. 12 is a schematic perspective view illustrating a coupling relationship between a second storage container SD_2 of a panel storage container SD and a display module DM of a display device 1' according to a comparative example. FIG. 13 is a schematic perspective view illustrating a state in which a force is applied in order to slide the second storage container SD_2 of the panel storage container SD according to an embodiment of FIG. 12. FIG. 14 is a schematic perspective view illustrating a state in which the display device 1' according to an embodiment of FIG. 12 is slid.

Referring to FIG. 12, a display device 1' according to a comparative example is substantially the same as or similar to the display device 1 according to an embodiment except that a guide rail GR' formed in a panel storage container SD is bent at a single curvature. Hereinafter, contents different from those described above will be described, and a redundant description will be briefly mentioned or omitted for descriptive convenience. For example, a second storage container SD_2 and a third storage container SD_3 of the display device 1' according to a comparative example are substantially the same as those of the display device 1 according to an embodiment described above except that they are symmetrical to each other in the first direction DR1, and thus, the second storage container SD_2 of the display device 1' according to a comparative example will be described and a description of the third storage container SD_3 will be omitted for descriptive convenience.

A guide rail GR' may be formed in the second storage container SD_2 of the display device 1' according to a comparative example.

The guide rail GR' may include a first flat portion 110, a second flat portion 170, and a bent portion. The first flat portion 110 and the second flat portion 170 of the guide rail GR' are substantially the same as the first flat portion 110 and the second flat portion 170 of the first guide rail GR1, and a redundant description thereof will thus be omitted for descriptive convenience.

The bent portion of the guide rail GR' may include a first bent portion 130', a second bent portion 150', and an orientation change portion 140'.

The first bent portion 130' and the second bent portion 150' may be bent at the same radius of curvature. For example, a length of an arc formed by the first bent portion 130' may be substantially the same as a length of an arc formed by the second bent portion 150'. Accordingly, as illustrated in FIG. 12, the number of segments SG engaged with the first bent portion 130' may be substantially the same as the number of segments SG engaged with the second bent portion 150'.

The orientation change portion 140' may be defined as a boundary area between the first bent portion 130' and the second bent portion 150'. For example, the orientation change portion 140' may be a portion where the first bent portion 130' and the second bent portion 150' are in contact with each other. A hole H' in which the roller R is disposed may be adjacent to the orientation change portion 140'.

Referring to FIGS. 13 and 14, by applying a first force F1' toward another side (e.g., right side) in the first direction DR1 to the second storage container SD_2 of the display device 1' according to a comparative example to slide the second storage container SD_2 to another side (e.g., right side) in the first direction DR1, the display device 1' according to a comparative example may be contracted (or reduced).

For example, segments SG engaged with the guide rail GR' should move in a direction toward another side (e.g., right side) in the first direction DR1 along the second flat portion 170 of the guide rail GR' in case that the second storage container SD_2 is slid to another side (e.g., right side) in the first direction DR1. For example, the segments SG engaged with the first bent portion 130' and the second bent portion 150' should move in a counterclockwise direction based on a side of the second direction DR2.

However, a force toward another side (e.g., right side) in the first direction DR1 may act (or press) on the segments SG disposed in each of the first and second bent portions 130' and 150'. For example, a second force F2' toward another side (e.g., right side) in the first direction DR1 may act (or press) on the segments SG disposed in the first bent portion 130', and a third force F3' toward another side (e.g., right side) in the first direction DR1 may act (or press) on the segments SG disposed in the second bent portion 150'. For example, since the segments SG disposed in the first bent portion 130' receive the second force F2' toward another side (e.g., right side) in the first direction DR1 intersecting the counterclockwise direction, which is a moving direction thereof, each of the segments SG disposed in the first bent portion 130' and the first flat portion 110 may be stagnant (or stuck) to receive compressive stress, as illustrated in FIG. 13. Accordingly, there is a risk that the sliding behavior for contracting the display device 1' may not be performed smoothly due to the above-described compressive stress.

Accordingly, it is necessary to prevent the compressive stress that is applied to each of the segments SG disposed in the first bent portion 130' and the first flat portion 110 due to the stagnation of each of the segments SG by making a magnitude of the third force F3' greater than a magnitude of the second force F2'.

Hereinafter, sliding behavior for contracting the display device 1 according to an embodiment will be described.

Figure 15:
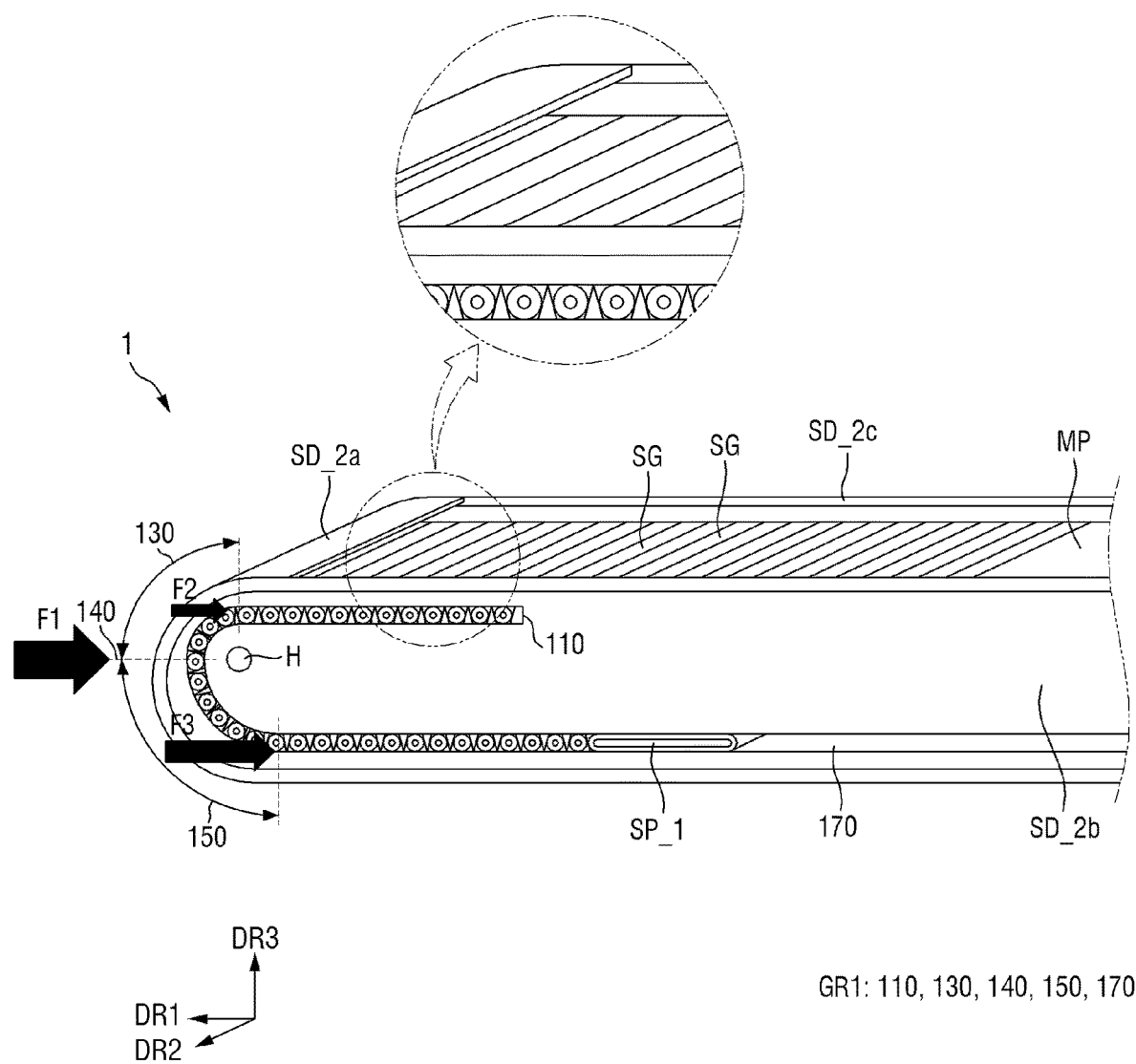
FIG. 15 is a schematic perspective view illustrating a state in which a force is applied in order to slide the second storage container of the panel storage container of the display device according to an embodiment of FIG. 8.
Figure 16:
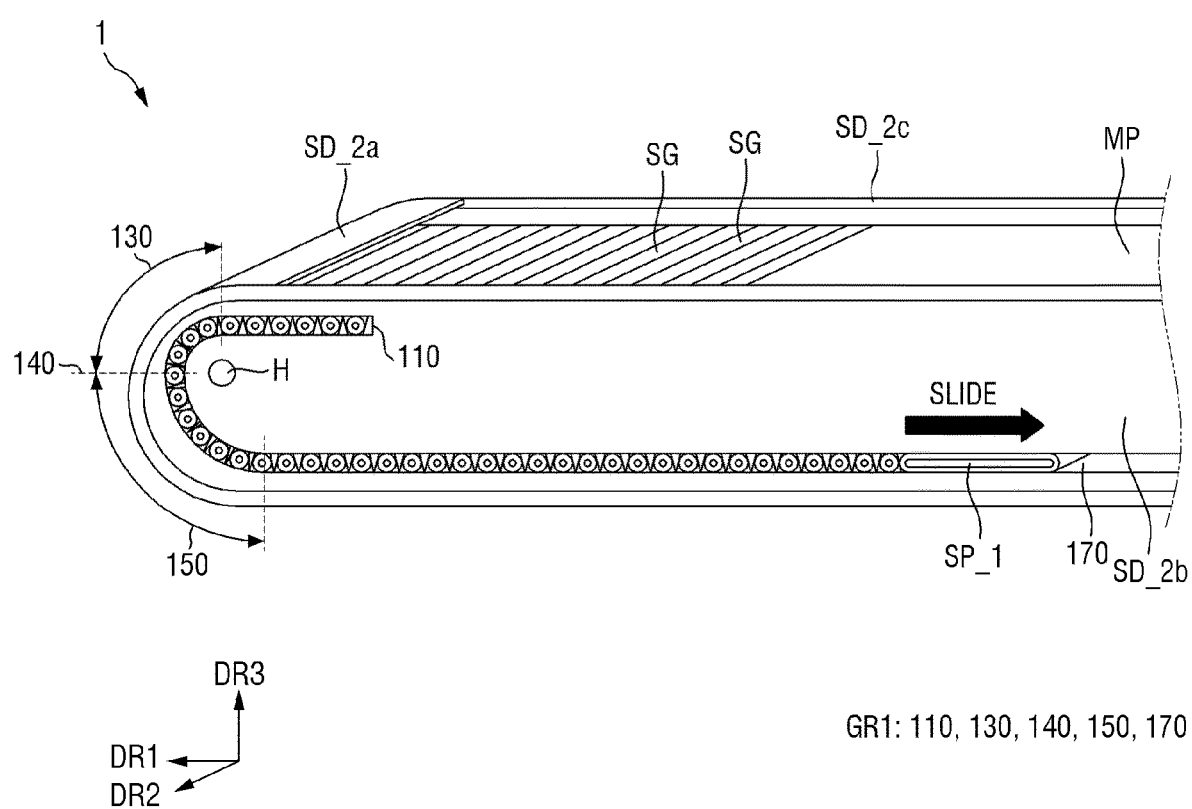
FIG. 16 is a schematic perspective view illustrating a state in which the display device according to an embodiment of FIG. 8 is slid.

FIG. 15 is a schematic perspective view illustrating a state in which a force is applied in order to slide the second storage container SD_2 of the panel storage container SD of the display device 1 according to an embodiment of FIG. 8. FIG. 16 is a schematic perspective view illustrating a state in which the display device 1 according to an embodiment of FIG. 8 is slid.

Sliding behavior of the second storage container SD_2 is substantially the same as sliding behavior of the third storage container SD_3 except that a direction thereof is symmetrical to that of the sliding behavior of the third storage container SD_3, and thus, the sliding behavior of the second storage container SD_2 will hereinafter be described and a detailed description of the sliding behavior of the third storage container SD_3 will be omitted for descriptive convenience.

Referring to FIGS. 15 and 16, by applying a first force F1 toward another side (e.g., right side) in the first direction DR1 to the second storage container SD_2 of the display device 1 according to an embodiment to slide the second storage container SD_2 to another side (e.g., right side) in the first direction DR1, the display device 1 according to an embodiment may be contracted (or reduced).

For example, the segments SG engaged with the first guide rail GR1 should move in a direction toward another side (e.g., right side) in the first direction DR1 along the second flat portion 170 of the first guide rail GR1 in case that the second storage container SD_2 is slid to another side (e.g., right side) in the first direction DR1. For example, the segments SG engaged with the first bent portion 130 and the second bent portion 150 should move in the counterclockwise direction based on a side of the second direction DR2.

A force toward another side (e.g., right side) in the first direction DR1 may act (or press) on the segments SG disposed in each of the first and second bent portions 130 and 150. For example, a second force F2 toward another side (e.g., right side) in the first direction DR1 may act (or press) on the segments SG disposed in the first bent portion 130, and a third force F3 toward another side (e.g., right side) in the first direction DR1 may act (or press) on the segments SG disposed in the second bent portion 150. For example, the segments SG disposed in the first bent portion 130 receive the second force F2 toward another side of the first direction DR1 intersecting the counterclockwise direction, which is a moving direction thereof, and the segments SG disposed in the second bent portion 150 may receive the third force F3 corresponding to the counterclockwise direction, which is a moving direction thereof.

As described above, the number of segments SG disposed on the second bent portion 150 may be greater than the number of segments SG disposed in the first bent portion 130, and thus, a magnitude of the third force F3 acting (or pressing) on the segments SG disposed in the second bent portion 150 may be greater than a magnitude of the second force F2. The magnitude of the third force F3 corresponding to the moving direction of the segments SG may be greater than the magnitude of the second force F2 intersecting the moving direction of the segments SG, and thus, the segments SG are prevented from being stagnant (or stuck), such that the sliding behavior for contracting the display device 1 may be readily performed.

Hereinafter, other embodiments of the display device 1 will be described. In the following embodiments, the same components as those of the above-described embodiment will be denoted by the same reference numerals, and a redundant description thereof will be omitted or simplified and contents different from those described above will be described for descriptive convenience.

Figure 17:
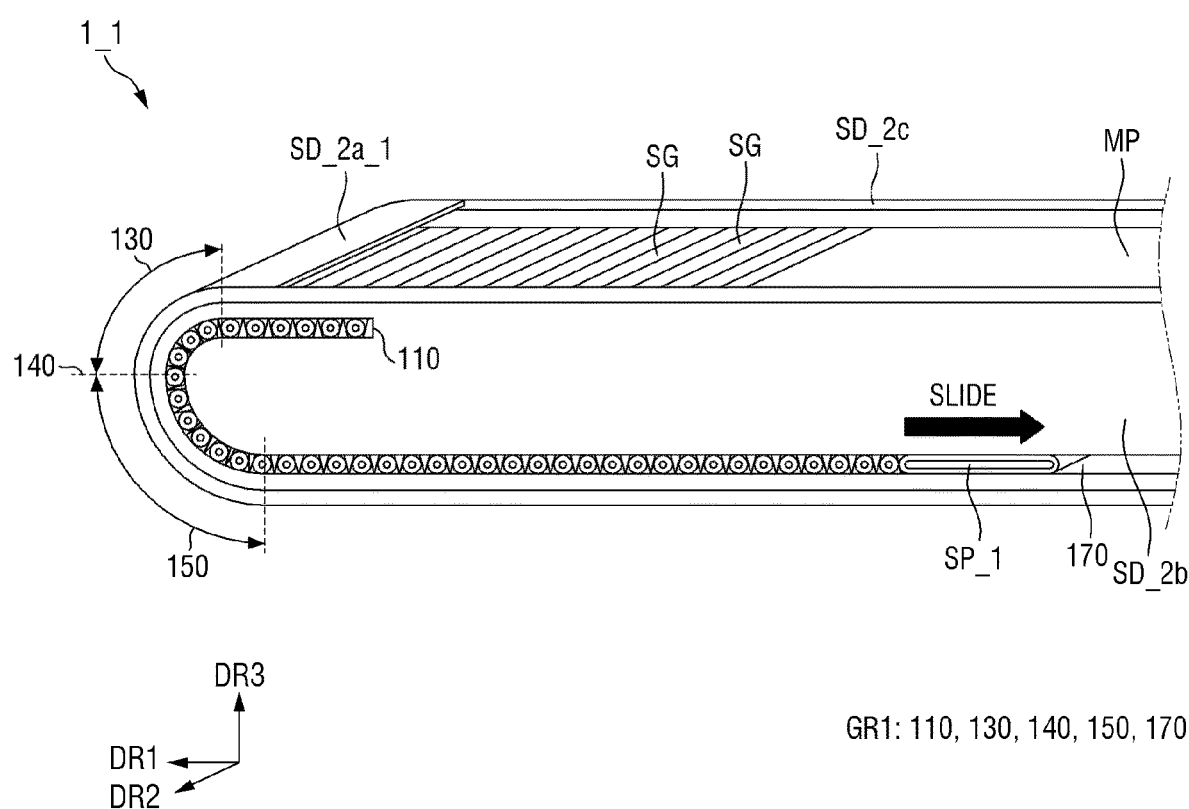
FIG. 17 is a schematic perspective view illustrating shapes of a panel storage container and a guide rail of a display device according to an embodiment.

FIG. 17 is a schematic perspective view illustrating shapes of a panel storage container SD and a first guide rail GR1 of a display device 1 according to an embodiment.

Referring to FIG. 17, it is illustrated that a shape of a cover part SD_2a_1 of a display device 1_1 may not be limited. For example, it is illustrated that a bent shape of the cover part SD_2a_1 of the display device 1_1 may follow (or correspond to) a shape of a first guide rail GR1 as the cover part SD_2a_1 is formed so that a curvature of a side thereof in the third direction DR3 is greater than a curvature of another side thereof in the third direction DR3. Accordingly, an aesthetic effect of an appearance of the display device 1_1 may be improved. It has been illustrated in FIG. 17 that the bent shape of the cover part SD_2a_1 follows (or corresponds to) the shape of the first guide rail GR1, but in case that the first guide rail GR1 of the display device 1 according to an embodiment of FIG. 8 is formed in a storage container SD of the display device 1_1, a shape of the cover part SD_2a_1 is not limited thereto.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
a display module slid in a first direction; and
a panel storage container including a guide rail guiding a sliding operation of the display module in the first direction, wherein
the display module is engaged with the guide rail in a second direction intersecting the first direction, and
the guide rail includes:
a first flat portion adjacent to an upper surface of the panel storage container and extending in the first direction;
a second flat portion adjacent to a lower surface of the panel storage container opposing the upper surface and extending in the first direction; and
a bent portion adjacent to a side surface of the panel storage container connecting the upper surface and the lower surface of the panel storage container to each other and connecting the first flat portion and the second flat portion of the guide rail to each other, the bent portion including:
a first bent portion bent at a first radius of curvature; and
a second bent portion connected to the first bent portion and bent at a second radius of curvature being greater than or equal to twice greater than the first radius of curvature.

2. The display device of claim 1, wherein
a first end portion of the first bent portion of the guide rail is connected to the first flat portion of the guide rail,
a second end portion of the first bent portion of the guide rail is connected to a first end portion of the second bent portion of the guide rail, and
a second end portion of the second bent portion of the guide rail is connected to the second flat portion of the guide rail.

3. The display device of claim 2, wherein the bent portion of the guide rail has a convex shape in a direction toward the side surface of the panel storage container.

4. The display device of claim 3, wherein an arc length of the second bent portion of the guide rail is greater than or equal to twice an arc length of the first bent portion of the guide rail.

5. The display device of claim 4, wherein
the first end portion of the first bent portion of the guide rail overlaps the second bent portion of the guide rail in a third direction perpendicular to the first direction and the second direction, and
the second end portion of the second bent portion of the guide rail overlaps the first flat portion of the guide rail in the third direction.

6. The display device of claim 4, wherein
the display module includes:
a display panel including a plurality of pixels on an upper surface of the display panel; and
a plurality of segments attached to a lower surface of the display panel opposing the upper surface of the display panel, and the plurality of segments are spaced apart from each other in the first direction and extend in the second direction intersecting the first direction to be engaged with the guide rail.

7. The display device of claim 6, wherein the number of segments engaged with the second bent portion among the plurality of segments is greater than the number of segments engaged with the first bent portion.

8. The display device of claim 3, wherein
the bent portion of the guide rail further includes a curvature change portion defined as a portion where the second end portion of the first bent portion of the guide rail and the first end portion of the second bent portion of the guide rail are connected to each other, and
the curvature change portion of the guide rail is disposed to be closer to the first flat portion than to the second flat portion.

9. The display device of claim 8, wherein an orientation of the display module is changed based on a portion engaged with the curvature change portion.

10. The display device of claim 9, further comprising a roller member surrounded by the display module that is bent, wherein the roller member is adjacent to the curvature change portion of the guide rail.

11. The display device of claim 9, wherein a straight line passing through the curvature change portion, a center of the first radius of curvature, and a center of the second radius of curvature is substantially parallel to the first direction.

12. A display device comprising:
a display module slid in a first direction; and
a panel storage container including a guide rail guiding a sliding operation of the display module in the first direction, wherein
the display module is engaged with the guide rail in a second direction intersecting the first direction,
the guide rail includes:
  a first flat portion adjacent to an upper surface of the panel storage container and extending in the first direction;
  a second flat portion adjacent to a lower surface of the panel storage container opposing the upper surface and extending in the first direction; and
  a bent portion adjacent to a side surface of the panel storage container and connecting the first flat portion and the second flat portion of the guide rail to each other, the bent portion including:
    a first bent portion bent toward the upper surface of the panel storage container; and
    a second bent portion connected to the first bent portion and bent toward the lower surface of the panel storage container, and
    an orientation change portion defined as a boundary area between the first bent portion and the second bent portion, and
an arc length of the first bent portion is less than or equal to half an arc length of the second bent portion.

13. The display device of claim 12, wherein the display module is engaged with the first flat portion, the first bent portion, the second bent portion, and the second flat portion to surround an inner portion of the panel storage container.

14. The display device of claim 13, wherein
the display module includes:
  a display panel including a plurality of pixels on an upper surface of the display panel; and
  a plurality of segments attached to a lower surface of the display panel opposing the upper surface of the display panel, and
the plurality of segments are spaced apart from each other in the first direction and extend in the second direction intersecting the first direction to be engaged with the guide rail.

15. The display device of claim 14, wherein the number of segments engaged with the second bent portion among the plurality of segments is greater than the number of segments engaged with the first bent portion.

16. The display device of claim 15, wherein the upper surface of the display panel is bent toward the upper surface of the panel storage container along the first bent portion, is bent toward the lower surface of the panel storage container along the second bent portion, and is oriented toward the second direction in the orientation change portion.

17. The display device of claim 16, wherein
the first bent portion of the guide rail is bent at a first radius of curvature, and
the second bent portion of the guide rail is bent at a second radius of curvature greater than or equal to twice the first radius of curvature.

18. A panel storage container storing a display panel, the panel storage container comprising:
a guide rail guiding a sliding operation of the display panel in a first direction and engaged with the display panel in a second direction intersecting the first direction, wherein
the guide rail includes:
  a first flat portion adjacent to an upper surface of the panel storage container and extending in the first direction;
  a second flat portion adjacent to a lower surface of the panel storage container opposing the upper surface and extending in the first direction; and
  a bent portion adjacent to a side surface of the panel storage container, having a bent shape, and connecting the first flat portion and the second flat portion to each other, the bent portion including:
    a first bent portion having a first radius of curvature; and
    a second bent portion connected to the first bent portion and having a second radius of curvature being greater than or equal to twice the first radius of curvature.

19. The panel storage container of claim 18, wherein
a first end portion of the first bent portion of the guide rail is connected to the first flat portion of the guide rail,
a second end portion of the first bent portion of the guide rail is connected to a first end portion of the second bent portion of the guide rail, and
a second end portion of the second bent portion of the guide rail is connected to the second flat portion of the guide rail.

20. The panel storage container of claim 19, wherein the bent portion of the guide rail has a convex shape in a direction toward the side surface of the panel storage container.

* * * * *